United States Patent
Sato et al.

(10) Patent No.: US 11,242,425 B2
(45) Date of Patent: Feb. 8, 2022

(54) RESIN COMPOSITION, PREPREG, RESIN-ADDED FILM, RESIN-ADDED METAL FOIL, METAL-CLAD LAYERED PLATE, AND WIRING PLATE

(71) Applicant: PANASONIC INTELLECTUAL PROPERTY MANAGEMENT CO., LTD., Osaka (JP)

(72) Inventors: Mikio Sato, Osaka (JP); Hiroaki Fujiwara, Nara (JP); Yuki Kitai, Osaka (JP); Masashi Koda, Fukushima (JP); Yasunori Hoshino, Osaka (JP); Takayoshi Ozeki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/050,671

(22) PCT Filed: Apr. 22, 2019

(86) PCT No.: PCT/JP2019/016952
§ 371 (c)(1),
(2) Date: Oct. 26, 2020

(87) PCT Pub. No.: WO2019/208471
PCT Pub. Date: Oct. 31, 2019

(65) Prior Publication Data
US 2021/0246251 A1 Aug. 12, 2021

(30) Foreign Application Priority Data

Apr. 27, 2018 (JP) .............................. JP2018-087155
Jul. 19, 2018 (JP) .............................. JP2018-136061
Mar. 13, 2019 (JP) .............................. JP2019-045680

(51) Int. Cl.
*C08F 290/06* (2006.01)
*C08J 5/24* (2006.01)
(Continued)

(52) U.S. Cl.
CPC .......... *C08F 290/062* (2013.01); *B32B 15/08* (2013.01); *B32B 27/285* (2013.01);
(Continued)

(58) Field of Classification Search
CPC ..................................................... B32B 15/08
See application file for complete search history.

(56) References Cited

U.S. PATENT DOCUMENTS

2004/0146692 A1 7/2004 Inoue et al.
2008/0254257 A1 10/2008 Inoue et al.

FOREIGN PATENT DOCUMENTS

JP 2006-516297 6/2006

OTHER PUBLICATIONS

Official Communication issued in International Patent Application No. PCT/JP2019/016952, dated Jul. 16, 2019, along with an English translation thereof.

*Primary Examiner* — Ian A Rummel
(74) *Attorney, Agent, or Firm* — Greenblum & Bernstein, P.L.C.

(57) ABSTRACT

A resin composition is provided and contains a compound (A) having at least one group represented by the following Formula (1) in a molecule, a crosslinking type curing agent (B), and an azo compound (C) that has an azo group in a molecule and has no heteroatom other than a nitrogen atom constituting the azo group.

[Chem. 1]

(Continued)

In Formula (1), n represents 0 to 10, Z represents an arylene group, and $R_1$ to $R_3$ each independently represent a hydrogen atom or an alkyl group.

25 Claims, 5 Drawing Sheets

(51) Int. Cl.
  *B32B 15/08* (2006.01)
  *B32B 27/28* (2006.01)
  *H05K 1/03* (2006.01)
(52) U.S. Cl.
  CPC ............ *C08J 5/244* (2021.05); *H05K 1/0366* (2013.01); *C08J 2371/12* (2013.01)

RESIN COMPOSITION, PREPREG, RESIN-ADDED FILM, RESIN-ADDED METAL FOIL, METAL-CLAD LAYERED PLATE, AND WIRING PLATE

TECHNICAL FIELD

The present invention relates to a resin composition, a prepreg, a film with resin, a metal foil with resin, a metal-clad laminate, and a wiring board.

BACKGROUND ART

As the information processing quantity by various kinds of electronic equipment increases, mounting technologies such as high integration of semiconductor devices to be mounted, densification of wiring, and multi-layering are progressing. In addition, wiring boards to be used in various kinds of electronic equipment are required to be, for example, high-frequency compatible wiring boards such as a millimeter-wave radar board for in-vehicle use. Wiring boards to be used in various kinds of electronic equipment are required to decrease the loss during signal transmission in order to increase the signal transmission speed, and this is especially required for high-frequency wiring boards. In order to meet this requirement, substrate materials for forming substrates of wiring boards to be used in various kinds of electronic equipment are required to have a low dielectric constant and a low dielectric loss tangent. Examples of such substrate materials include a resin composition containing polyphenylene ether.

Meanwhile, molding materials such as substrate materials are required to exhibit not only excellent low dielectric properties but also excellent heat resistance and the like. From this fact, it is considered that the resin contained in the substrate material is modified so as to be polymerized together with a curing agent and the like and, for example, a vinyl group and the like are introduced thereinto to improve the heat resistance.

Examples of such substrate materials include the resin composition described in Patent Literature 1. Patent Literature 1 describes a polyphenylene ether compound which contains polyphenylene ether and a crosslinking type curing agent, has a polyphenylene ether moiety in the molecular structure, an ethenylbenzyl group and the like at this molecule terminal, and a number average molecular weight of 1,000 to 7,000.

Patent Literature 1 discloses that a laminate which has a low dielectric constant and a low dielectric loss tangent and exhibits high heat resistance, moldability and the like can be obtained. It is considered that a wiring board obtained by using a resin composition exhibiting low dielectric properties such as dielectric constant and dielectric loss tangent as described in Patent Literature 1 can decrease the loss during signal transmission. On the other hand, it is required that the signal transmission speed on the wiring board is further increased and the heat resistance is higher from the viewpoint of product stability and the like. Hence, the material used as a substrate material is required to exhibit lower dielectric properties and higher heat resistance.

CITATION LIST

Patent Literature

Patent Literature 1: JP 2006-516297 A

SUMMARY OF INVENTION

The present invention has been made in view of such circumstances, and an object thereof is to provide a resin composition which provides a cured product exhibiting low dielectric properties and high heat resistance. Another object of the present invention is to provide a prepreg, a film with resin, a metal foil with resin, a metal-clad laminate, and a wiring board which are obtained using the resin composition.

An aspect of the present invention is a resin composition containing a compound (A) having at least one group represented by the following Formula (1) in a molecule, a crosslinking type curing agent (B), and an azo compound (C) that has an azo group in a molecule and has no heteroatom other than a nitrogen atom constituting the azo group.

[Chem. 1]

In Formula (1), n represents 0 to 10, Z represents an arylene group, and $R_1$ to $R_3$ each independently represent a hydrogen atom or an alkyl group.

The above and other objects, features, and advantages of the present invention will be apparent from the following detailed description.

DESCRIPTION OF EMBODIMENTS

Figure 1:
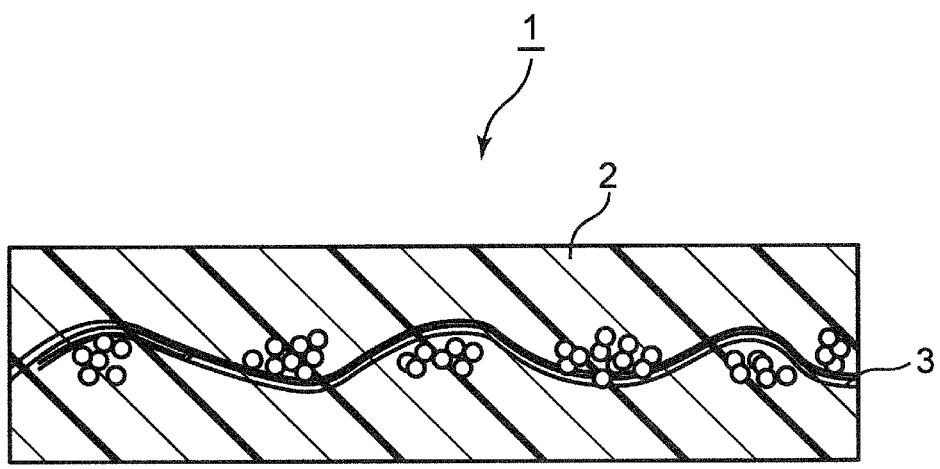
FIG. 1 is a schematic sectional view illustrating an example of a prepreg according to an embodiment of the present invention.

The present inventors have carried out various investigations in order to provide a resin composition which is superior in heat resistance and low dielectric properties to the conventional resin compositions, for example, the resin composition described in Patent Literature 1. At that time, attention has been paid to the fact that the resin composition described in Patent Literature 1 has a high dielectric constant and a high dielectric loss tangent in some cases. Moreover, the present inventors have carried out investigations based on an inference that the dielectric properties such as dielectric constant and dielectric loss tangent are also affected by the kind of initiator and, as a result, found out that the dielectric constant and dielectric loss tangent tend to increase when the initiator described in Patent Literature 1 is used. Specifically, the dielectric constant and dielectric loss tangent tend to increase when an azo compound containing a hetero atom in addition to an azo group and a peroxide are used as an initiator. As the reason for this, it has first been inferred that the dielectric constant and dielectric loss tangent increase when an azo compound containing a hetero atom in addition to an azo group since a highly polar group such as a CN group is generated in the cured product of the resin composition. It has also been inferred that the dielectric constant and dielectric loss tangent increase even when a peroxide is used as an initiator since highly polar groups such as an ether group and a hydroxyl group are generated in the cured product of the resin composition. Hence, the present inventors have achieved the following invention by using an initiator other than an azo compound containing a hetero atom in addition to an azo group and a peroxide, namely, an azo compound which has an azo group in the molecule and has no heteroatom other than a nitrogen atom constituting the azo group as an initiator.

Hereinafter, embodiments according to the present invention will be described, but the present invention is not limited thereto.

[Resin Composition]

The resin composition according to the embodiments of the present invention is a resin composition containing a compound (A) having at least one group represented by the following Formula (1) in the molecule, a crosslinking type curing agent (B), and an azo compound (C) that has an azo group in the molecule and has no heteroatom other than a nitrogen atom constituting the azo group.

[Chem. 2]

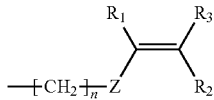

(1)

In Formula (1), n represents 0 to 10. Z represents an arylene group. $R_1$ to $R_3$ are independent of each other. In other words, $R_1$ to $R_3$ may be the same group as or different groups from each other. $R_1$ to $R_3$ represent a hydrogen atom or an alkyl group.

The arylene group in Formula (1) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (1) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

It is considered that the resin composition provides a cured product exhibiting high heat resistance as the compound (A) and the crosslinking type curing agent (B) are reacted to be crosslinked with each other. It is considered that the azo compound (C) contained in the resin composition acts as an initiator at the time of this reaction. As described above, this azo compound (C) contains a nitrogen atom that is a hetero atom in the azo group contained in the molecule and has no heteroatom other than the nitrogen atom constituting the azo group. It is considered that a highly polar group such as a CN group is hardly generated in the cured product of the resin composition and a cured product having a low dielectric constant and a low dielectric loss tangent is obtained when the compound (A) and the crosslinking type curing agent (B) are reacted using such an azo compound (C) as an initiator.

From the above fact, a resin composition having the configuration is a resin composition which provides a cured product exhibiting low dielectric properties and high heat resistance.

(Compound (A))

The compound (A) is not particularly limited as long as it is a compound having at least one group represented by Formula (1) in the molecule. In Formula (1), when n is 0, it indicates that Z that is an arylene group is directly bonded to the terminal or the molecular chain of the compound (A).

Examples of the compound (A) include a modified polyphenylene ether compound having the group represented by Formula (1) at the terminal of the molecule and a polymer having a structural unit represented by the following Formula (5) in the molecule.

[Chem. 3]

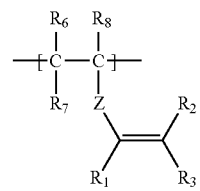

(5)

In Formula (5), Z represents an arylene group. $R_1$ to $R_3$ are independent of each other. In other words, $R_1$ to $R_3$ may be the same group as or different groups from each other. $R_1$ to $R_3$ represent a hydrogen atom or an alkyl group. $R_6$ to $R_8$ are independent of each other. In other words, $R_6$ to $R_8$ may be the same group as or different groups from each other. $R_6$ to $R_8$ represent a hydrogen atom or an alkyl group having 1 to 6 carbon atoms.

As described above, the compound (A) is only required to have the group represented by Formula (1), and the atom to which this group is bonded is not particularly limited and may be, for example, an oxygen atom or a carbon atom. Specifically, in the case of the modified polyphenylene ether compound, examples of the atom to which the group represented by Formula (1) is bonded include an oxygen atom at the terminal of the main chain. In the case of a polymer having a structural unit represented by Formula (5) in the molecule, examples of the atom to which the group represented by Formula (1) is bonded include carbon atoms constituting the main chain as represented by Formula (5). As the compound (A), these may be used singly or both of these may be used in combination.

(Modified Polyphenylene Ether Compound)

The modified polyphenylene ether compound is not particularly limited as long as it is a modified polyphenylene ether compound having the group represented by Formula (1) at the terminal of the molecule. Specific preferred examples of the group represented by Formula (1) include a group represented by the following Formula (11).

[Chem. 4]

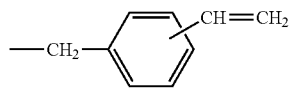

(11)

More specific examples of the substituent containing the vinylbenzyl group include vinylbenzyl groups (ethenylbenzyl groups) such as a p-ethenylbenzyl group and a m-ethenylbenzyl group and a vinylphenyl group.

The modified polyphenylene ether compound has a polyphenylene ether chain in the molecule and preferably has, for example, a structural unit represented by the following Formula (12) in the molecule.

[Chem. 5]

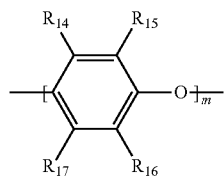

(12)

In Formula (12), m represents 1 to 50. $R_{14}$ to $R_{17}$ are independent of each other. In other words, $R_{14}$ to $R_{17}$ may be the same group as or different groups from each other. $R_{14}$ to $R_{17}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_{14}$ to $R_{17}$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

Examples of the modified polyphenylene ether compound include a modified polyphenylene ether compound represented by the following Formula (13) and a modified polyphenylene ether compound represented by the following Formula (14). Moreover, as the modified polyphenylene ether compound, these modified polyphenylene ether compounds may be used singly or two kinds of these modified polyphenylene ether compounds may be used in combination.

[Chem. 6]

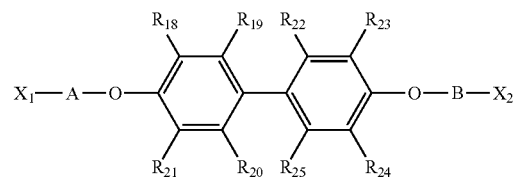

(13)

[Chem. 7]

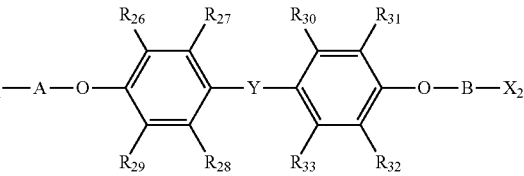

(14)

In Formulas (13) and (14), $R_{18}$ to $R_{25}$ and $R_{26}$ to $R_{33}$ each independently represent a hydrogen atom, an alkyl group, an alkenyl group, an alkynyl group, a formyl group, an alkylcarbonyl group, an alkenylcarbonyl group, or an alkynylcarbonyl group. $X_1$ and $X_2$ each independently represent a group represented by Formula (1). A and B each represent structural units represented by the following Formulas (15) and (16). In Formula (14), Y represents a linear, branched, or cyclic hydrocarbon having 20 or less carbon atoms.

[Chem. 8]

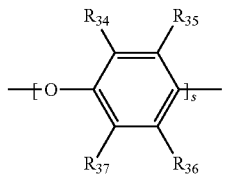

(15)

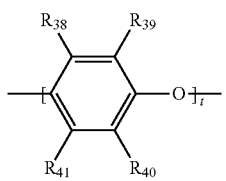

(16)

In Formulas (15) and (16), s and t each represent 0 to 20. $R_{34}$ to $R_{37}$ and $R_{38}$ to $R_{41}$ each independently represent a hydrogen atom, an alkyl group, an alkenyl group, an alkynyl group, a formyl group, an alkylcarbonyl group, an alkenylcarbonyl group, or an alkynylcarbonyl group.

The modified polyphenylene ether compound represented by Formula (13) and the modified polyphenylene ether compound represented by Formula (14) are not particularly limited as long as they satisfy the above configuration. Specifically, in Formulas (13) and (14), $R_{18}$ to $R_{25}$ and $R_{26}$ to $R_{33}$ are independent of each other as described above. In other words, $R_{18}$ to $R_{25}$ and $R_{26}$ to $R_{33}$ may be the same group as or different groups from each other. $R_{18}$ to $R_{25}$ and $R_{26}$ to $R_{33}$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

$R_{18}$ to $R_{41}$ are the same as $R_{14}$ to $R_{17}$ in Formula (12).

In Formula (14), Y represents a linear, branched, or cyclic hydrocarbon having 20 or less carbon atoms as described above. Examples of Y include a group represented by the following Formula (17).

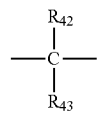

(17)

In Formula (17), $R_{42}$ and $R_{43}$ each independently represent a hydrogen atom or an alkyl group. Examples of the alkyl group include a methyl group. Examples of the group represented by Formula (17) include a methylene group, a methylmethylene group, and a dimethylmethylene group. Among these, a dimethylmethylene group is preferable.

More specific examples of the modified polyphenylene ether compound represented by Formula (13) include a modified polyphenylene ether compound represented by the following Formula (18).

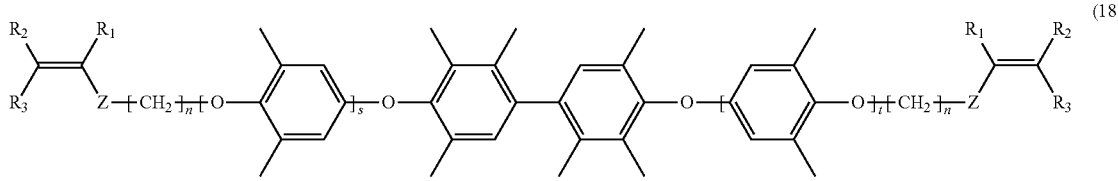

(18)

More specific examples of the modified polyphenylene ether compound represented by Formula (14) include a modified polyphenylene ether compound represented by the following Formula (19)

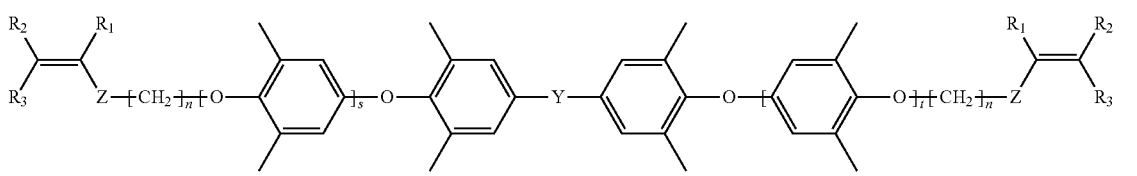

(19)

In Formulas (15) and (16), s and t each preferably represent 0 to 20 as described above. It is preferable that s and t represent numerical values so that the sum of s and t is 1 to 30. Hence, it is more preferable that s represents 0 to 20, t represents 0 to 20, and the sum of s and t represents 1 to 30. $R_{34}$ to $R_{37}$ and $R_{38}$ to $R_{41}$ are independent of each other. In other words, $R_{34}$ to $R_{37}$ and $R_{38}$ to $R_{41}$ may be the same group as or different groups from each other. $R_{34}$ to $R_{37}$ and $R_{38}$ to $R_{41}$ represent a hydrogen atom, an alkyl group, an alkenyl group, an alkynyl group, a formyl group, an alkylcarbonyl group, an alkenylcarbonyl group, or an alkynylcarbonyl group.

In Formulas (18) and (19), s and t are the same as s and t in Formulas (15) and (16). In Formulas (18) and (19), $R_1$ to $R_3$ and n are the same as $R_1$ to $R_3$ and n in Formula (1). In Formula (19), Y is the same as Y in Formula (14).

(Polymer Having Structural Unit Represented by Formula (5) in Molecule)

The polymer is not particularly limited as long as it is a polymer having the structural unit represented by Formula (5) in the molecule. The polymer may have a structural unit other than the structural unit represented by Formula (5) as long as it is a polymer having the structural unit represented by Formula (5) in the molecule. The polymer may include a repeating unit in which the structural unit represented by Formula (5) is repeatedly bonded, or the polymer may be a polymer in which a repeating unit in which the structural unit represented by Formula (5) is repeatedly bonded and a repeating unit in which a structural unit other than the structural unit represented by Formula (5) is repeatedly bonded are randomly bonded. In other words, the polymer may be a block copolymer or a random copolymer when the polymer has a structural unit other than the structural unit represented by Formula (5).

The arylene group in Formula (5) is not particularly limited. Examples of this arylene group include a monocyclic aromatic group such as a phenylene group, and a polycyclic aromatic group in which the aromatic is not a single ring but a polycyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

The alkyl group represented by $R_1$ to $R_3$ in Formula (5) is similar to the alkyl group represented by $R_1$ to $R_3$ in Formula (1). In other words, the alkyl group represented by $R_1$ to $R_3$ in Formula (5) is not particularly limited, and for example, an alkyl group having 1 to 18 carbon atoms is preferable and an alkyl group having 1 to 10 carbon atoms is more preferable. Specific examples thereof include a methyl group, an ethyl group, a propyl group, a hexyl group, and a decyl group.

The alkyl group having 1 to 6 carbon atoms represented by $R_6$ to $R_8$ in Formula (5) is not particularly limited, and specific examples thereof include a methyl group, an ethyl group, a propyl group, and a hexyl group.

It is preferable that the polymer includes an aromatic polymer having a structural unit derived from a bifunctional aromatic compound in which two carbon-carbon unsaturated double bonds are bonded to an aromatic ring as the structural unit represented by Formula (5). The structural unit derived from a bifunctional aromatic compound is a structural unit obtained by polymerizing the bifunctional aromatic compound. In the present specification, the aromatic polymer is also referred to as a divinyl aromatic polymer.

The bifunctional aromatic compound is not particularly limited as long as it is a bifunctional aromatic compound in which two carbon-carbon unsaturated double bonds are bonded to an aromatic ring. Examples of the bifunctional aromatic compound include m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 4,4'-divinylbiphenyl, 4,3'-divinylbiphenyl, 4,2'-divinylbiphenyl, 3,2'-divinylbiphenyl, 3,3'-divinylbiphenyl, 2,2'-divinylbiphenyl, 2,4-divinylbiphenyl, 1,2-divinyl-3,4-dimethylbenzene, 1,3-divinyl-4,5,8-tributylnaphthalene, and 2,2'-divinyl 4-ethyl-4'-propylbiphenyl. These may be used singly or in combination of two or more kinds thereof. Among these, the bifunctional aromatic compound is preferably divinylbenzene such as m-divinylbenzene and p-divinylbenzene, more preferably p-divinylbenzene.

The aromatic polymer may have not only a structural unit derived from the bifunctional aromatic compound but also another structural unit. Examples of the other structural unit include a structural unit derived from a monofunctional aromatic compound in which one carbon-carbon unsaturated double bond is bonded to an aromatic ring, a structural unit derived from a trifunctional aromatic compound in which three carbon-carbon unsaturated double bonds are bonded to an aromatic ring, structural units derived from indenes, and structural units derived from acenaphthylenes. The structural unit derived from a monofunctional aromatic compound is a structural unit obtained by polymerizing the monofunctional aromatic compound. The structural unit derived from a trifunctional aromatic compound is a structural unit obtained by polymerizing the trifunctional aromatic compound. The structural units derived from indenes are structural units obtained by polymerizing indenes. The structural units derived from acenaphthylenes are structural units obtained by polymerizing acenaphthylenes.

In the monofunctional aromatic compound, it is only required that one carbon-carbon unsaturated double bond is bonded to an aromatic ring, and a group other than the carbon-carbon unsaturated double bond may be bonded to the aromatic ring. Examples of the monofunctional aromatic compound include a monofunctional aromatic compound in which one carbon-carbon unsaturated double bond is bonded to an aromatic ring and a group other than this carbon-carbon unsaturated double bond is not bonded the aromatic ring and a monofunctional aromatic compound in which one carbon-carbon unsaturated double bond is bonded to an aromatic ring and an alkyl group such as an ethyl group is further bonded to the aromatic ring.

Examples of the monofunctional aromatic compound in which one carbon-carbon unsaturated double bond is bonded to an aromatic ring and a group other than this carbon-carbon unsaturated double bond is not bonded the aromatic ring include styrene, 2-vinylbiphenyl, 3-vinylbiphenyl, 4-vinylbiphenyl, 1-vinylnaphthalene, 2-vinylnaphthalene, and α-alkyl-substituted styrene. Examples of the α-alkyl-substituted styrene include α-methylstyrene, α-ethylstyrene, α-propylstyrene, α-n-butylstyrene, α-isobutylstyrene, α-t-butylstyrene, α-n-pentylstyrene, α-2-methylbutylstyrene, α-3-methylbutyl-2-styrene, α-t-butylstyrene, α-t-butylstyrene, α-n-pentylstyrene, α-2-methylbutylstyrene, α-3-methylbutylstyrene, α-t-pentylstyrene, α-n-hexylstyrene, α-2-methylpentylstyrene, α-3-methylpentylstyrene, α-1-methylpentylstyrene, α-2,2-dimethylbutylstyrene, α-2,3-dimethylbutylstyrene, α-2,4-dimethylbutylstyrene, α-3,3-dimethylbutylstyrene, α-3,4-dimethylbutylstyrene, α-4,4-dimethylbutylstyrene, α-2-ethylbutylstyrene, α-1-ethylbutylstyrene, α-cyclohexylstyrene, and α-cyclohexylstyrene. These may be used singly or in combination of two or more kinds thereof.

Examples of monofunctional aromatic compounds in which one carbon-carbon unsaturated double bond is bonded to an aromatic ring and an alkyl group is further bonded to the aromatic ring include a nuclear alkyl-substituted aromatic compound and alkoxy-substituted styrene.

Examples of the nuclear alkyl-substituted aromatic compound include an ethyl vinyl aromatic compound in which an alkyl group bonded to an aromatic ring is an ethyl group, nuclear alkyl-substituted styrene in which an alkyl group is bonded to styrene as an aromatic ring, and nuclear alkyl-substituted aromatic compounds (other nuclear alkyl-substituted aromatic compounds) other than the ethyl vinyl aromatic compound and the nuclear alkyl-substituted styrene.

Examples of the ethyl vinyl aromatic compound include o-ethyl vinyl benzene, m-ethylvinylbenzene, p-ethylvinylbenzene, 2-vinyl-2'-ethylbiphenyl, 2-vinyl-3'-ethylbiphenyl, 2-vinyl-4-ethylbiphenyl, 3-vinyl-2'-ethylbiphenyl, 3-vinyl-3'-ethylbiphenyl, 3-vinyl-4'-ethylbiphenyl, 4-vinyl-2'-ethylbiphenyl, 4-vinyl-3'-ethylbiphenyl, 4-vinyl-4'-ethylbiphenyl, 1-vinyl-2-ethylnaphthalene, 1-vinyl-3-ethylnaphthalene, 1-vinyl-4-ethylnaphthalene, 1-vinyl-5-ethylnaphthalene, 1-vinyl-6-ethylnaphthalene, 1-vinyl-7-ethylnaphthalene, 1-vinyl-8-ethylnaphthalene, 2-vinyl-1-ethylnaphthalene, 2-vinyl-3-ethylnaphthalene, 2-vinyl-4-ethylnaphthalene, 2-vinyl-5-ethylnaphthalene, 2-vinyl-6-ethylnaphthalene, 2-vinyl-7-ethylnaphthalene, and 2-vinyl-8-ethylnaphthalene.

Examples of the nuclear alkyl-substituted styrene include m-methylstyrene, p-methylstyrene, m-propylstyrene, p-propylstyrene, m-n-butylstyrene, p-n-butylstyrene, m-t-butylstyrene, p-t-butylstyrene, m-n-hexylstyrene, p-n-hexylstyrene, m-cyclohexylstyrene, and p-cyclohexylstyrene.

Examples of the other nuclear alkyl-substituted aromatic compounds include 2-vinyl-2'-propylbiphenyl, 2-vinyl-3'-propylbiphenyl, 2-vinyl-4'-propylbiphenyl, 3-vinyl-2'-propylbiphenyl, 3-vinyl-3'-propylbiphenyl, 3-vinyl-4'-propylbiphenyl, 4-vinyl-2'-propylbiphenyl, 4-vinyl-3'-propylbiphenyl, 4-vinyl-4'-propylbiphenyl, 1-vinyl-2-propylnaphthalene, 1-vinyl-3-propylnaphthalene, 1-vinyl-4-propylnaphthalene, 1-vinyl-5-propylnaphthalene, 1-vinyl-6-propylnaphthalene, 1-vinyl-7-propylnaphthalene, 1-vinyl-8-propylnaphthalene, 2-vinyl-1-propylnaphthalene, 2-vinyl-3-propylnaphthalene, 2-vinyl-4-propylnaphthalene, 2-vinyl-5-propylnaphthalene, 2-vinyl-6-propylnaphthalene, 2-vinyl-7-propylnaphthalene, and 2-vinyl-8-propylnaphthalene.

Examples of the alkoxy-substituted styrene include o-ethoxystyrene, m-ethoxystyrene, p-ethoxystyrene, o-propoxystyrene, m-propoxystyrene, p-propoxystyrene, o-n-butoxystyrene, m-n-butoxystyrene, p-n-butoxystyrene, o-isobutoxystyrene, m-isobutoxystyrene, p-isobutoxystyrene, o-t-butoxystyrene, m-t-butoxystyrene, p-t-butoxystyrene, o-n-pentoxystyrene, m-n-pentoxystyrene, p-n-pentoxystyrene, α-methyl-o-butoxystyrene, α-methyl-m-butoxystyrene, α-methyl-p-butoxystyrene, o-t-pentoxystyrene, m-t-pentoxystyrene, p-t-pentoxystyrene, o-n-hexoxystyrene, n-n-hexoxystyrene, p-n-hexoxystyrene, α-methyl-o-pentoxystyrene, α-methyl-m-pentoxystyrene, α-methyl-p-pentoxystyrene, o-cyclohexoxystyrene, m-cyclohexoxystyrene, p-cyclohexoxystyrene, o-phenoxystyrene, m-phenoxystyrene, and p-phenoxystyrene.

As the monofunctional aromatic compound, the compounds exemplified above may be used singly or in combination of two or more kinds thereof. Among the compounds exemplified above, styrene and p-ethylvinylbenzene are preferable as the monofunctional aromatic compound.

Examples of the trifunctional aromatic compound in which three carbon-carbon unsaturated double bonds are bonded to an aromatic ring include 1,2,4-trivinylbenzene, 1,3,5-trivinylbenzene, 1,2,4-triisopropenylbenzene, 1,3,5-triisopropenylbenzene, 1,3,5-trivinylnaphthalene, and 3,5,4'-trivinylbiphenyl. As the trifunctional aromatic compound, the compounds exemplified above may be used singly or in combination of two or more kinds thereof.

Examples of the indenes include indene, alkyl-substituted indene, and alkoxyindene. Examples of the alkyl-substituted indene include methylindene, ethylindene, propylindene, butylindene, t-butylindene, sec-butylindene, n-pentylindene, 2-methyl-butylindene, 3-methyl-butylindene, n-hexylindene, 2-methyl-pentylindene, 3-methyl-pentylindene, and 4-methyl-pentylindene. Examples of the alkyloxyindene include alkyloxyindenes such as methoxyindene, ethoxyindene, propoxyindene, butoxyindene, t-butoxyindene, sec-butoxyindene, n-pentoxyindene, 2-methyl-butoxyindene, 3-methyl-butoxyindene, n-hexoxyindene, 2-methyl-pentoxyindene, 3-methyl-pentoxyindene, and 4-methyl-pentoxyindene. As the indenes, the compounds exemplified above may be used singly or in combination of two or more kinds thereof.

Examples of the acenaphthylenes include acenaphthylene, alkylacenaphthylenes, halogenated acenaphthylenes, and phenylacenaphthylenes. Examples of the alkyl acenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. As the acenaphthylenes, the compounds exemplified above may be used singly or in combination of two or more kinds thereof.

When the aromatic polymer has not only a structural unit derived from the bifunctional aromatic compound but also another structural unit, the aromatic polymer is a copolymer of a structural unit derived from the bifunctional aromatic compound and another structural unit such as a structural unit derived from the monofunctional aromatic compound. This copolymer may be a block copolymer or a random copolymer.

The polymer is not particularly limited as long as it is a polymer having the structural unit represented by Formula (5) in the molecule as described above. It is preferable that the structural unit represented by Formula (5) includes a structural unit represented by the following Formula (6). In other words, the polymer is preferably a polymer having a structural unit represented by the following Formula (6) in the molecule.

[Chem. 13]

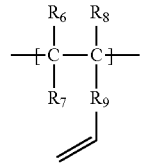

(6)

$R_6$ to $R_8$ in Formula (6) are similar to $R_6$ to $R_8$ in Formula (5). Specifically, $R_6$ to $R_8$ each independently represent a hydrogen atom or an alkyl group having 1 to 6 carbon atoms. $R_9$ represents an arylene group having 6 to 12 carbon atoms.

The arylene group having 6 to 12 carbon atoms in Formula (6) is not particularly limited. Examples of this arylene group include a monocyclic aromatic group such as a phenylene group and a bicyclic aromatic group in which the aromatic is not a monocyclic ring but a bicyclic aromatic such as a naphthalene ring. This arylene group also includes a derivative in which a hydrogen atom bonded to an aromatic ring is substituted with a functional group such as an alkenyl group, an alkynyl group, a formyl group, an alkylcarbonyl group, an alkenylcarbonyl group, or an alkynylcarbonyl group.

It is preferable that the structural unit represented by Formula (6) includes a structural unit represented by the following Formula (7). In other words, in the structural unit represented by Formula (6), $R_9$ is preferably a phenylene group. Among the phenylene groups, a p-phenylene group is more preferable.

[Chem. 14]

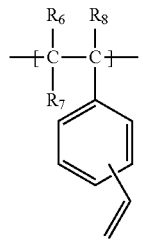

(7)

$R_6$ to $R_8$ in Formula (7) are similar to $R_6$ to $R_8$ in Formula (5). Specifically, $R_6$ to $R_8$ each independently represent a hydrogen atom or an alkyl group having 1 to 6 carbon atoms.

The polymer preferably includes a polymer having a structural unit represented by the following Formula (8) in the molecule. In other words, it is preferable that the polymer has a structural unit derived from a monofunctional aromatic compound in which one carbon-carbon unsaturated double bond is bonded to an aromatic ring as the structural unit represented by the following Formula (8). Hence, the polymer is preferably a polymer having a structural unit represented by Formula (5) and a structural unit represented by the following Formula (8) in the molecule. In other words, the polymer may have a structural unit other than the structural unit represented by Formula (5) and the structural unit represented by the following Formula (8) (structural unit other than (5) and (8)) as long as it is a polymer having a structural unit represented by Formula (5) and the structural unit represented by the following Formula (8) in the molecule. The polymer may include a structural unit other than (5) and (8), the polymer may be a polymer in which a repeating unit in which the structural unit represented by Formula (5) is repeatedly bonded, a repeating unit in which the structural unit represented by the following Formula (8) is repeatedly bonded, and a repeating unit in which a structural unit other than (5) and (8) is repeatedly bonded are randomly bonded, or the polymer may be a block copolymer or a random copolymer.

[Chem. 15]

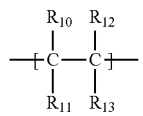

(8)

In Formula (8), $R_{10}$ to $R_{12}$ are independent of each other. In other words, $R_{10}$ to $R_{12}$ may be the same group as or different groups from each other. $R_{10}$ to $R_{12}$ represent a hydrogen atom or an alkyl group having 1 to 6 carbon atoms. $R_{13}$ represents an aryl group.

The alkyl group having 1 to 6 carbon atoms represented by $R_{10}$ to $R_{12}$ in Formula (8) is not particularly limited and may be similar to the alkyl group having 1 to 6 carbon atoms represented by $R_6$ to $R_8$ in Formula (5). Specific examples of the alkyl group having 1 to 6 carbon atoms represented by $R_{10}$ to $R_{12}$ in Formula (8) include a methyl group, an ethyl group, a propyl group, and a hexyl group.

The aryl group in Formula (8) is not particularly limited and may be an unsubstituted aryl group or an aryl group in which a hydrogen atom bonded to an aromatic ring is substituted with an alkyl group or the like. The unsubstituted aryl group may be a group obtained by eliminating one hydrogen atom from an aromatic hydrocarbon having one aromatic ring or a group obtained by eliminating one hydrogen atom from an aromatic hydrocarbon having two or more independent aromatic rings (for example, biphenyl). Examples of the aryl group in Formula (8) include an unsubstituted aryl group having 6 to 12 carbon atoms and an arylene group having 6 to 18 carbon atoms in which a hydrogen atom of an aryl group having 6 to 12 carbon atoms is substituted with an alkyl group having 1 to 6 carbon atoms. Examples of the unsubstituted aryl group having 6 to 12 carbon atoms include a phenyl group, a naphthyl group, and a biphenylyl group. Specific examples of the aryl group in Formula (8), namely, $R_{13}$ include the aryl groups presented in the following Tables 1 and 2.

TABLE 1

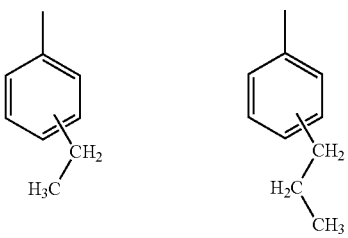

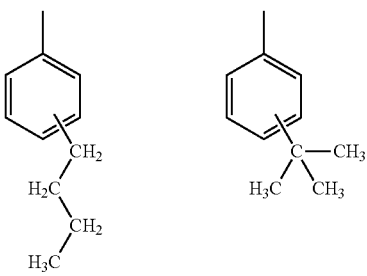

TABLE 2

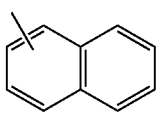
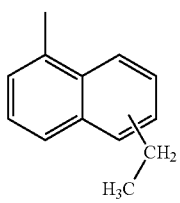

TABLE 2-continued

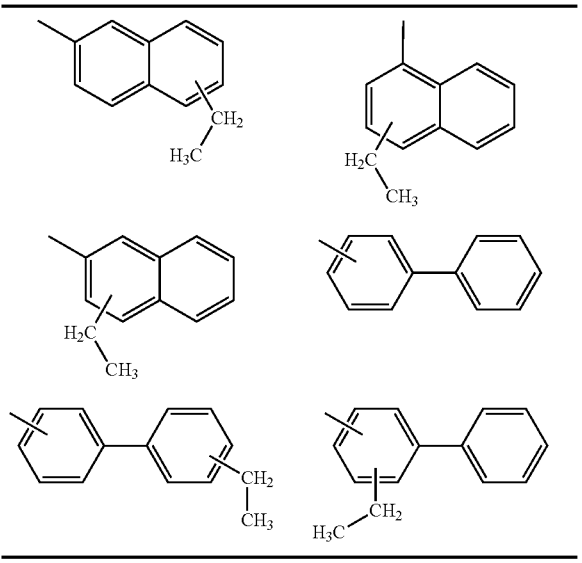

The compound (A) is only required to be a compound having at least one group represented by Formula (1) in the molecule and may be, for example, the modified polyphenylene ether compound or the polymer, and the modified polyphenylene ether compound and the polymer may be used concurrently.

The weight average molecular weight of the compound (A) is preferably 1,500 to 40,000, more preferably 1,500 to 35,000. When the weight average molecular weight is too low, the heat resistance and the like tend to decrease. When the weight average molecular weight is too high, the moldability and the like tend to decrease. Hence, when the weight average molecular weight of the resin composition is within the above range, excellent heat resistance and moldability are exhibited. Here, the weight average molecular weight is only required to be one measured by general molecular weight measurement, and specific examples thereof include a value measured by gel permeation chromatography (GPC).

In the polymer, when the sum of structural units in the polymer is 100 mol %, the molar content of the structural unit represented by Formula (5) is preferably a molar content within the range of the weight average molecular weight. Specifically, the molar content is preferably 2 to 95 mol %, more preferably 8 to 81 mol %. The molar content of the structural unit represented by Formula (6) and the molar content of the structural unit represented by Formula (7) are similar to the molar content of the structural unit represented by Formula (5). Specifically, the molar contents are preferably 2 to 95 mol %, more preferably 8 to 81 mol %. When the polymer is a polymer having a structural unit represented by Formula (5) and a structural unit represented by Formula (8) in the molecule, the molar content of the structural unit represented by Formula (5) is preferably 2 to 95 mol %, more preferably 8 to 81 mol % and the molar content of the structural unit represented by Formula (8) is preferably 5 to 98 mol %, more preferably 19 to 92 mol %.

In the polymer, the average number of structural units represented by Formula (5) is preferably a number within the range of the weight average molecular weight. Specifically, the average number is preferably 1 to 160, more preferably 3 to 140. The average number of structural units represented by Formula (6) and the average number of structural units represented by Formula (7) are similar to the average number of structural units represented by Formula (5). Specifically, the average number is preferably 1 to 160, more preferably 3 to 140. When the polymer is a polymer having a structural unit represented by Formula (5) and a structural unit represented by Formula (8) in the molecule, the average number of structural units represented by Formula (5) is preferably 1 to 160, more preferably 3 to 140 and the average number of structural units represented by Formula (8) is preferably 2 to 350, more preferably 4 to 300.

Specific examples of the polymer include a polymer having a structural unit represented by the following Formula (21) in the molecule and further at least either of a structural unit represented by the following Formula (20) or a structural unit represented by the following Formula (22). This polymer may be a block copolymer or a random copolymer.

[Chem. 16]

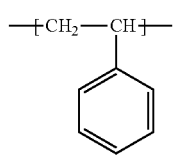

(20)

[Chem. 17]

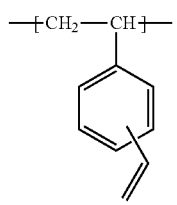

(21)

[Chem. 18]

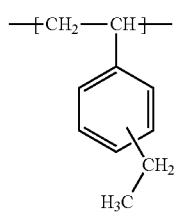

(22)

In the polymer having the structural unit represented by Formula (21) in the molecule and further at least either of the structural unit represented by Formula (20) or the structural unit represented by Formula (22), the molar contents of the structural unit represented by Formula (20), the structural unit represented by Formula (21), and the structural unit represented by Formula (22) are preferably 0 to 92 mol %, 8 to 54 mol %, and 0 to 89 mol %, respectively. The average number of structural units represented by Formula (20) is preferably 0 to 350, the average number of structural units represented by Formula (21) is preferably 1 to 160, and the average number of structural units represented by Formula (22) is preferably 0 to 270. As the polymer, for example, commercially available products such as ODV-XET(X03), ODV-XET(X04), and ODV-XET(X05) manufactured by NIPPON STEEL Chemical & Materials Co., Ltd. are used.

The equivalent of the vinyl group included in the group that is represented by Formula (1) and contains a hydrogen atom as $R_1$ to $R_3$ in the compound (A) is preferably 250 to 1200, more preferably 300 to 1100. When the equivalent is too small, the number of groups represented by Formula (1) is too large, the reactivity is too high, and for example, troubles such as deterioration in the storage stability of the resin composition or deterioration in the fluidity of the resin composition may occur. When a resin composition in which the equivalent is too small is used, for example, molding defects such as generation of voids at the time of multilayer molding may occur by insufficient fluidity and the like and a problem with moldability that a highly reliable wiring board is hardly obtained may occur. When the equivalent is too large, the number of the groups represented by Formula (1) is too small and the heat resistance of the cured product tends to be insufficient. Hence, when the equivalent of the group represented by Formula (1) in the resin composition is within the above range, excellent heat resistance and moldability are exhibited. The equivalent of the vinyl group included in the group that is represented by Formula (1) and contains a hydrogen atom as $R_1$ to $R_3$ is a so-called vinyl equivalent.

(Crosslinking Type Curing Agent (B))

The crosslinking type curing agent (B) is not particularly limited as long as it is a curing agent which reacts with the compound (A), is crosslinked with the compound (A), and thus can cure the resin composition. Examples of the crosslinking type curing agent (B) include a compound having two or more unsaturated double bonds in the molecule, an alkenyl isocyanurate compound, styrene, a styrene derivative, an allyl compound having at least one or more allyl groups in the molecule, a maleimide compound having at least one or more maleimide groups in the molecule, a modified maleimide compound, and an acenaphthylene compound having an acenaphthylene structure in the molecule. Examples of the compound having two or more unsaturated double bonds in the molecule include a polyfunctional methacrylate compound having two or more methacryloyl groups in the molecule, a polyfunctional acrylate compound having two or more acryloyl groups in the molecule, and a polyfunctional vinyl compound having two or more vinyl groups in the molecule. Examples of the polyfunctional vinyl compound include divinylbenzene and polybutadiene. The alkenyl isocyanurate compound is only required to be a compound having an isocyanurate structure and an alkenyl group in the molecule, and examples thereof include trialkyl isocyanurate compounds such as triallyl isocyanurate (TAIC). Examples of the styrene derivative include bromostyrene. Examples of the modified maleimide compound include a modified maleimide compound in which a part of the molecule is amine-modified, a modified maleimide compound in which a part of the molecule is silicone-modified, and a modified maleimide compound in which a part of the molecule is amine-modified and silicone-modified. Among these, the alkenyl isocyanurate compound, the polyfunctional acrylate compound, the polyfunctional methacrylate compound, and the polyfunctional vinyl compound are preferable from the viewpoint that the heat resistance of the cured product of the resin composition can be further enhanced. It is considered that this is because crosslinking of the resin composition is more suitably formed by the curing reaction when using these crosslinking type curing agents. As the crosslinking type curing agent, the crosslinking type curing agents exemplified may be used singly or in combination of two or more kinds thereof. As the crosslinking type curing agent, not only the crosslinking type curing agents exemplified above such as the compound having two or more unsaturated double bonds in the molecule but also a compound having one unsaturated double bond in the molecule may be used concurrently. Examples of the compound having one unsaturated double bond in the molecule include a monovinyl compound having one vinyl group in the molecule.

Examples of the polyfunctional methacrylate compound include a compound having a polyphenylene ether structure and two or more methacryloyl groups in the molecule and tricyclodecane dimethanol dimethacrylate. Examples of the compound having a polyphenylene ether structure and two or more methacryloyl groups in the molecule include a methacryl-modified polyphenylene ether compound obtained by modifying the terminal hydroxyl group of polyphenylene ether with a methacryl group. Specific examples thereof include compounds in which the substituents at the $X_1$ and $X_2$ moieties of the modified polyphenylene ether compound represented by Formula (13) or the modified polyphenylene ether compound represented by Formula (14) are substituted with a methacryloyl group. More specific examples of this methacryl-modified polyphenylene ether compound include a compound represented by the following Formula (23).

[Chem. 19]

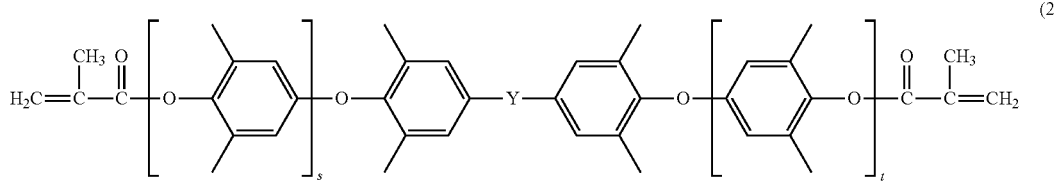

(23)

In Formula (23), s and t are the same as s and t in Formulas (15) and (16). In Formula (23), Y is the same as Y in Formula (14).

As the crosslinking type curing agent (B), for example, styrene, divinylbenzene, trialkenyll isocyanurate compounds such as triallyl isocyanurate (TAIC), a polybutadiene compound, a maleimide compound, and an acenaphthylene compound are also preferably used. Among these, a maleimide compound is preferable, and a monofunctional maleimide compound having one maleimide group in the molecule is more preferable. Specific preferred examples of the monofunctional maleimide compound include a compound represented by the following Formula 9) and a compound represented by the following Formula (10).

[Chem. 20]

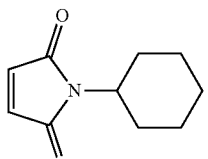
(9)

[Chem. 21]

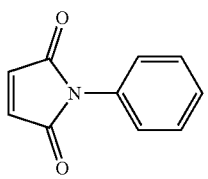
(10)

The acenaphthylene compound is not particularly limited as long as it is a compound having an acenaphthylene skeleton, and examples thereof include acenaphthylene and acenaphthylene derivatives. Specific examples of the acenaphthylene compound include an acenaphthylene, a hydroxyacenaphthylene compound, an alkyl acenaphthylene compound, an alkoxy acenaphthylene compound, and a halogenated acenaphthylene compound. Examples of the hydroxyacenaphthylene compound include 3-hydroxyacenaphthylene, 4-hydroxyacenaphthylene, 5-hydroxyacenaphthylene, and 5,6-dihydroxyacenaphthylene. Examples of the alkyl acenaphthylene compound include 3-methylacenaphthylene, 3-ethylacenaphthylene, 3-propylacenaphthylene, 4-methylacenaphthylene, 4-ethylacenaphthylene, 4-propylacenaphthylene, 5-methylacenaphthylene, 5-ethylacenaphthylene, 5-propylacenaphthylene, 3,8-dimethylacenaphthylene, and 5,6-dimethylacenaphthylene compound. Examples of the alkoxy acenaphthylene compound include 3-methoxyacenaphthylene, 3-ethoxyacenaphthylene, 3-butoxyacenaphthylene, 4-methoxyacenaphthylene, 4-ethoxyacenaphthylene, 4-butoxyacenaphthylene, 5-methoxyacenaphthylene, 5-ethoxyacenaphthylene, and 5-butoxyacenaphthylene. Examples of the halogenated acenaphthylene compound include 3-chloroacenaphthylene, 3-bromoacenaphthylene, 4-chloroacenaphthylene, 4-bromoacenaphthylene, 5-chloroacenaphthylene, and 5-bromoacenaphthylene.

(Azo Compound (C))

The azo compound (C) is not particularly limited as long as it has an azo group in the molecule and has no heteroatom other than the nitrogen atom constituting the azo group. Specific examples of the azo compound (C) include the azo initiator represented by Formula (2).

[Chem. 22]

$R_4-N=N-R_5$ (2)

In Formula (2), $R_4$ and $R_5$ are independent of each other. In other words, $R_4$ and $R_5$ may be the same group as or different groups from each other. $R_4$ and $R_5$ represent a hydrogen atom or an alkyl group. The alkyl group of $R_4$ and $R_5$ may be a linear alkyl group or a branched alkyl group. The alkyl group of $R_4$ and $R_5$ preferably has 1 to 8 carbon atoms.

The linear alkyl group is only required to be linear and has preferably 1 to 8 carbon atoms, preferably 4 to 8 carbon atoms. Specific examples of the linear alkyl group include a butyl group, a pentyl group, a hexyl group, and an octyl group.

The branched alkyl group is only required to be branched and has preferably 3 to 8 carbon atoms, more preferably 4 to 8 carbon atoms. Specific examples of the branched alkyl group include a t-butyl group and a 2,2',4,4'-tetramethylbutyl group.

The azo compounds (C) may be used singly or in combination of two kinds or more thereof. Specific preferred examples of the azo compound (C) include a compound represented by the following Formula (3) and a compound represented by the following Formula (4).

[Chem. 23]

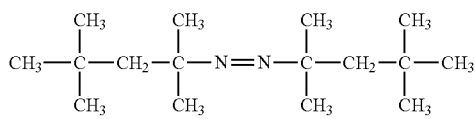
(3)

[Chem. 24]

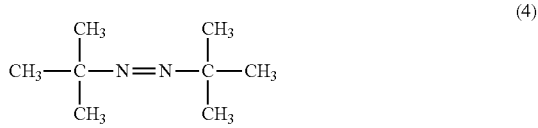
(4)

(Content)

The content of the compound (A) is preferably 50 to 90 parts by mass, more preferably 60 to 80 parts by mass with respect to 100 parts by mass of the total mass of the compound (A) and the crosslinking type curing agent (B). The content of the crosslinking type curing agent (B) is preferably 10 to 50 parts by mass, more preferably 20 to 40 parts by mass with respect to 100 parts by mass of the total mass of the compound (A) and the crosslinking type curing agent (B). The content of the azo compound (C) is preferably 0.01 to 2 parts by mass, more preferably 0.1 to 1 part by mass with respect to 100 parts by mass of the total mass of the compound (A) and the crosslinking type curing agent (B). When the contents of the compound (A), the crosslinking type curing agent (B), and the azo compound (C) are within the above ranges, the obtained resin composition can suitably provide a cured product exhibiting low dielectric properties and high heat resistance. Among the contents of the compound (A), the crosslinking type curing agent (B), and the azo compound (C), for example, when the content of the azo compound (C) is too large, the heat resistance tends to decrease.

When the compound (A) contains the polymer, the content ratio of the polymer to the acenaphthylene compound (B) is preferably 50:50 to 95:5, more preferably 60:40 to 95:5 in terms of mass ratio.

When the compound (A) is concurrently used with the modified polyphenylene ether compound and the polymer, the content of the modified polyphenylene ether compound is preferably 5 to 50 parts by mass, more preferably 5 to 40 parts by mass with respect to 100 parts by mass of the sum of the modified polyphenylene ether compound, the polymer, and the acenaphthylene compound (B). The content of the polymer is preferably 20 to 95 parts by mass, more preferably 30 to 70 parts by mass with respect to 100 parts by mass of the sum of the modified polyphenylene ether compound, the polymer, and the acenaphthylene compound (B).

(Other Components)

The resin composition according to the present embodiment may contain components (other components) other than the compound (A), the crosslinking type curing agent (B), and the azo compound (C) if necessary as long as the effects of the present invention are not impaired. As the other components to be contained in the resin composition according to the present embodiment, for example, additives such as a silane coupling agent, a flame retardant, a defoaming agent, an antioxidant, a heat stabilizer, an antistatic agent, an ultraviolet absorber, a dye and a pigment, a lubricant, and an inorganic filler may be further contained. The resin composition may contain thermosetting resins such as an epoxy resin, an unsaturated polyester resin, and a thermosetting polyimide resin in addition to the compound (A).

As described above, the resin composition according to the present embodiment may contain a silane coupling agent. The silane coupling agent may be contained in the resin composition or may be contained as a silane coupling agent covered on the inorganic filler to be contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance.

Examples of the silane coupling agent include a silane coupling agent having at least one functional group selected from the group consisting of a vinyl group, a styryl group, a methacryloyl group, an acryloyl group, and a phenylamino group. In other words, examples of this silane coupling agent include compounds having at least one of a vinyl group, a styryl group, a methacryloyl group, an acryloyl group, or a phenylamino group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene which have a melting point of 300° C. or more are preferable. It is considered that the elimination of halogen at a high temperature and the deterioration in heat resistance can be suppressed by the use of a halogen-based flame retardant. In the field of being required to be free of halogen, a phosphoric ester-based flame retardant, a phosphazene-based flame retardant, a bis(diphenylphosphine oxide)-based flame retardant, and a phosphinate-based flame retardant are exemplified. Specific examples of the phosphoric ester-based flame retardant include a condensed phosphoric ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as aluminum dialkyl phosphinate. As the flame retardant, the flame retardants exemplified may be used singly or in combination of two or more kinds thereof.

As described above, the resin composition according to the present embodiment may contain a filler such as an inorganic filler. Examples of the filler include those to be added to enhance the heat resistance and flame retardancy of a cured product of the resin composition, but the filler is not particularly limited. The heat resistance, flame retardancy and the like can be further enhanced by containing a filler. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. As the filler, silica, mica, and talc are preferable and spherical silica is more preferable among these. The filler may be used singly or in combination of two or more kinds thereof. The filler may be used as it is, or a filler subjected to a surface treatment with the silane coupling agent may be used. When a filler is contained, the content thereof (filler content) is preferably 30 to 270 mass %, more preferably 50 to 250 mass % with respect to the resin composition.

(Production Method)

The method for manufacturing the resin composition is not particularly limited, and examples thereof include a method in which the compound (A), the crosslinking type curing agent (B), and the azo compound (C) are mixed together so as to have predetermined contents. Specific examples thereof include the method to be described later in the case of obtaining a varnish-like composition containing an organic solvent.

Moreover, by using the resin composition according to the present embodiment, a prepreg, a metal-clad laminate, a wiring board, a metal foil with resin, and a film with resin can be obtained as described below.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is in a state in which the resin composition has been semi-cured (B-staged). For example, when the resin composition is heated, the viscosity gradually decreases at first, and then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the B-stage resin composition) and a fibrous base material or a prepreg including the resin composition before being cured (the A-stage resin composition) and a fibrous base material. The resin composition or a semi-cured product of the resin composition may be one obtained by drying or heating and drying the resin composition.

When manufacturing a prepreg, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent to be used here is not particularly limited as long as it dissolves the compound (A), the crosslinking type curing agent (B), the azo compound (C) and the like and does not inhibit the curing reaction. Specific examples thereof include toluene and methyl ethyl ketone (MEK).

The method for manufacturing the prepreg is not particularly limited as long as the prepreg can be manufactured. Specifically, when manufacturing a prepreg, the resin composition which has been described above and is used in the present embodiment is often prepared in a varnish form and used as a resin varnish as described above.

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less.

The method for manufacturing the prepreg is not particularly limited as long as the prepreg can be manufactured. Specifically, when manufacturing a prepreg, the resin composition according to the present embodiment described above is often prepared in a varnish form and used as a resin varnish as described above.

Examples of the method for manufacturing the prepreg 1 include a method in which the fibrous base material 3 is impregnated with the resin composition 2, for example, the resin composition 2 prepared in a varnish form, and then dried.

The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 80° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition which provides a cured product exhibiting low dielectric properties and high heat resistance. Hence, the prepreg including this resin composition or a semi-cured product of the resin composition is a prepreg which suitably provides a cured product exhibiting low dielectric properties and high heat resistance. Moreover, this prepreg is a prepreg from which a wiring board including an insulating layer exhibiting low dielectric properties and high heat resistance can be manufactured.

[Metal-Clad Laminate]

Figure 2:
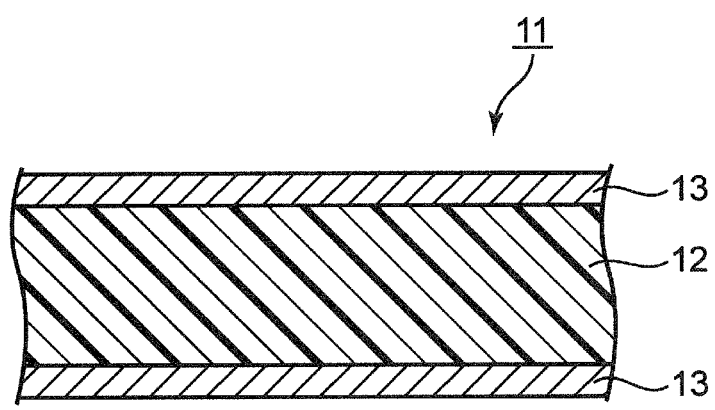
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 includes an insulating layer 12 containing a cured product of the prepreg 1 illustrated in FIG. 1 and a metal foil 13 to be laminated together with the insulating layer 12. In other words, the metal-clad laminate 11 includes the insulating layer 12 containing a cured product of a resin composition and the metal foil 13 provided on the insulating layer 12. The insulating layer 12 may be formed of a cured product of the resin composition or a cured product of the prepreg. The thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 µm. Moreover, examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11 to be manufactured, the kind of the composition of the prepreg 1, and the like. For example, it is possible to set the temperature to 170° C. to 210° C., the pressure to 3.5 to 4 MPa, and the time to 60 to 150 minutes. The metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition which provides a cured product exhibiting low dielectric properties and high heat resistance. Hence, a metal-clad laminate including an insulating layer containing a cured product of this resin composition is a metal-clad laminate including an insulating layer exhibiting low dielectric properties and high heat resistance. Moreover, this metal-clad laminate is a metal-clad laminate from which a wiring board including an insulating layer exhibiting low dielectric properties and high heat resistance can be manufactured.

[Wiring Board]

Figure 3:
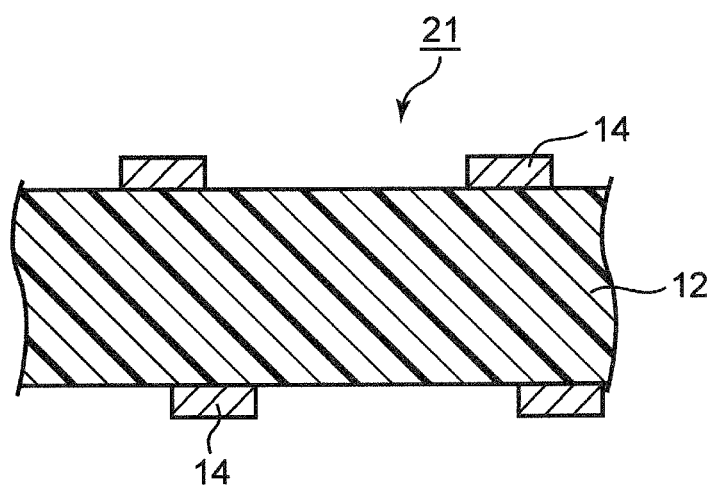
FIG. 3 is a schematic sectional view illustrating an example of a wiring board according to an embodiment of the present invention.

FIG. 3 is a schematic sectional view illustrating an example of a wiring board 21 according to an embodiment of the present invention.

The wiring board 21 according to the present embodiment is formed of an insulating layer 12 obtained by curing the prepreg 1 illustrated in FIG. 1 and wiring 14 which is laminated together with the insulating layer 12 and is formed by partially removing the metal foil 13 as illustrated in FIG. 3. In other words, the wiring board 21 includes the insulating layer 12 containing a cured product of a resin composition and the wiring 14 provided on the insulating layer 12. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 1 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above. The wiring board 21 includes the insulating layer 12 having a high glass transition temperature, a low water absorption rate, and sufficiently suppressed increases in the dielectric constant and dielectric loss tangent due to water absorption even after water absorption.

Such a wiring board is a wiring board including an insulating layer exhibiting low dielectric properties and high heat resistance.

[Metal Foil with Resin]

Figure 4:
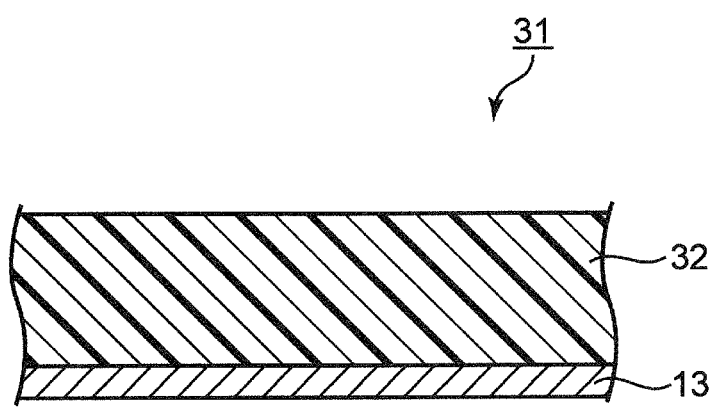
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the B-stage resin composition) and a metal foil or a metal foil with resin including a resin layer containing the resin composition before being cured (the A-stage resin composition) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils to be used in metal-clad laminates can be used without being limited. Examples of the metal foil include a copper foil and an aluminum foil.

The metal foil with resin 31 and a film with resin 41 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 80° C. or more and 180° C. or less and 1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition which provides a cured product exhibiting low dielectric properties and high heat resistance. Hence, the metal foil with resin including a resin layer containing this resin composition or a semi-cured product of this resin composition is a metal foil with resin which suitably provides a cured product exhibiting low dielectric properties and high heat resistance. Moreover, this metal foil with resin can be used when manufacturing a wiring board including an insulating layer exhibiting low dielectric properties and high heat resistance. For example, by laminating the metal foil with resin on a wiring board, a multilayer wiring board can be manufactured. As the wiring board obtained by using such a metal foil with resin, a wiring board including an insulating layer exhibiting low dielectric properties and high heat resistance is obtained.

[Film with Resin]

Figure 5:
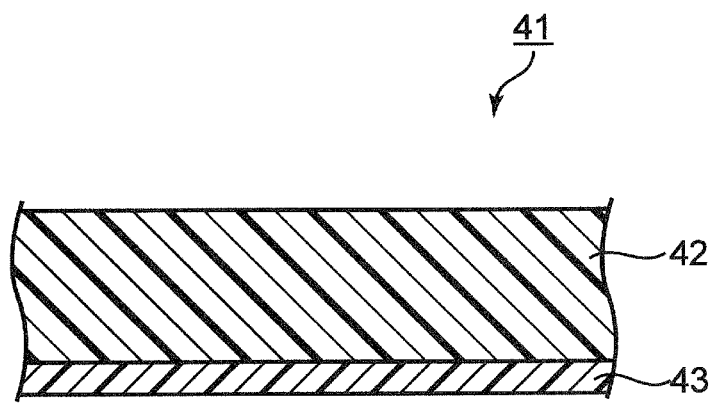
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the B-stage resin composition) and a support film or a film with resin including a resin layer containing the resin composition before being cured (the A-stage resin composition) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films to be used in films with resin can be used without being limited. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 80° C. or more and 180° C. or less and 1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition which provides a cured product exhibiting low dielectric properties and high heat resistance. Hence, the film with resin including a resin layer containing this resin composition or a semi-cured product of this resin composition is a film with resin which suitably provides a cured product exhibiting low dielectric properties and high heat resistance. Moreover, this film with resin can be used when manufacturing a wiring board including an insulating layer exhibiting low dielectric properties and high heat resistance. A multilayer wiring board can be manufactured, for example, by laminating the film with resin on a wiring board and then peeling off the support film from the film with resin or by peeling off the support film from the film with resin and then laminating the film with resin on a wiring board. As the wiring board obtained by using such a film with resin, a wiring board including an insulating layer exhibiting low dielectric properties and high heat resistance is obtained.

The present specification discloses various aspects of a technology as described above, but the main technology is summarized below.

An aspect of the present invention is a resin composition containing a compound (A) having at least one group represented by the following Formula (1) in a molecule, a crosslinking type curing agent (B), and an azo compound (C) that has an azo group in a molecule and has no heteroatom other than a nitrogen atom constituting the azo group.

[Chem. 25]

(1)

In Formula (1), n represents 0 to 10, Z represents an arylene group, and $R_1$ to $R_3$ each independently represent a hydrogen atom or an alkyl group.

According to such a configuration, it is possible to provide a resin composition which provides a cured product exhibiting low dielectric properties and high heat resistance. It is considered that this is because a highly polar group such as a CN group is hardly generated in the cured product of the resin composition when the compound (A) and the crosslinking type curing agent (B) are reacted using the azo compound (C) as an initiator.

In the resin composition, the azo compound (C) preferably includes an azo initiator represented by the following Formula (2).

[Chem. 26]

$R_4$—N=N—$R_5$ (2)

In Formula (2), $R_4$ and $R_5$ each independently represent a hydrogen atom or an alkyl group.

According to such a configuration, it is possible to obtain a resin composition which provides a cured product exhibiting low dielectric properties and high heat resistance. It is considered that this is because the compound (A) and the crosslinking type curing agent (B) can be suitably reacted while suppressing the generation of highly polar groups such as a CN group in the cured product of the resin composition when the azo compound (C) is used as an initiator.

In the resin composition, the alkyl group of $R_4$ and $R_5$ preferably has 1 to 8 carbon atoms.

According to such a configuration, it is possible to obtain a resin composition which provides a cured product exhibiting low dielectric properties and high heat resistance.

In the resin composition, the azo compound (C) preferably includes at least either of a compound represented by the following Formula (3) or a compound represented by the following Formula (4).

[Chem. 27]

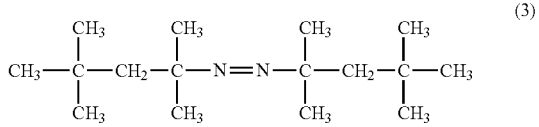

(3)

[Chem. 28]

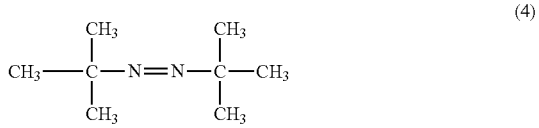

(4)

According to such a configuration, it is possible to obtain a resin composition which provides a cured product exhibiting low dielectric properties and high heat resistance.

In the resin composition, the weight average molecular weight of the compound (A) is preferably 1,500 to 40,000.

According to such a configuration, it is possible to obtain a resin composition which provides a cured product exhibiting low dielectric properties and high heat resistance and exhibits excellent moldability.

In the resin composition, the equivalent of the vinyl group included in the group that is represented by Formula (1) and contains a hydrogen atom as $R_1$ to $R_3$ in the compound (A) is preferably 250 to 1200.

According to such a configuration, it is possible to obtain a resin composition which provides a cured product exhibiting low dielectric properties and high heat resistance and exhibits excellent moldability.

In the resin composition, the compound (A) preferably includes a modified polyphenylene ether compound having the group represented by Formula (1) at the molecule terminal.

According to such a configuration, it is possible to obtain a resin composition which provides a cured product exhibiting low dielectric properties and high heat resistance.

In the resin composition, the compound (A) preferably includes a polymer having a structural unit represented by the following Formula (5) in the molecule.

[Chem. 29]

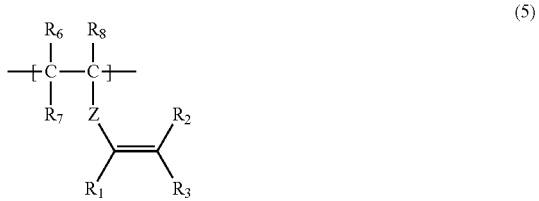

(5)

In Formula (5), Z represents an arylene group, $R_1$ to $R_3$ each independently represent a hydrogen atom or an alkyl group, and $R_6$ to $R_8$ each independently represent a hydrogen atom or an alkyl group having 1 to 6 carbon atoms.

According to such a configuration, it is possible to obtain a resin composition which provides a cured product exhibiting low dielectric properties and high heat resistance.

In the resin composition, the compound (A) preferably includes a modified polyphenylene ether compound having the group represented by Formula (1) at the molecule terminal and a polymer having a structural unit represented by Formula (5) in the molecule.

According to such a configuration, it is possible to obtain a resin composition which provides a cured product exhibiting low dielectric properties and high heat resistance.

In the resin composition, the content of the modified polyphenylene ether compound is preferably 5 to 50 parts by mass with respect to 100 parts by mass of the sum of the modified polyphenylene ether compound, the polymer, and the crosslinking type curing agent (B).

According to such a configuration, it is possible to obtain a resin composition which provides a cured product exhibiting low dielectric properties and high heat resistance.

In the resin composition, the content of the polymer is preferably 20 to 95 parts by mass with respect to 100 parts by mass of the sum of the modified polyphenylene ether compound, the polymer, and the crosslinking type curing agent (B).

According to such a configuration, it is possible to obtain a resin composition which provides a cured product exhibiting low dielectric properties and high heat resistance.

In the resin composition, the polymer preferably includes an aromatic polymer having a structural unit derived from a bifunctional aromatic compound in which two carbon-carbon unsaturated double bonds are bonded to an aromatic ring as the structural unit represented by Formula (5). In the resin composition, the aromatic polymer may further have a structural unit derived from a monofunctional aromatic compound in which one carbon-carbon unsaturated double bond is bonded to an aromatic ring.

According to such a configuration, it is possible to obtain a resin composition which provides a cured product exhibiting low dielectric properties and high heat resistance.

In the resin composition, the structural unit represented by Formula (5) preferably includes a structural unit represented by the following Formula (6).

[Chem. 30]

(6)

In Formula (6), $R_6$ to $R_8$ each independently represent a hydrogen atom or an alkyl group having 1 to 6 carbon atoms and $R_9$ represents an arylene group having 6 to 12 carbon atoms.

According to such a configuration, it is possible to obtain a resin composition which provides a cured product exhibiting low dielectric properties and high heat resistance.

In the resin composition, the structural unit represented by Formula (6) preferably includes a structural unit represented by the following Formula (7).

[Chem. 31]

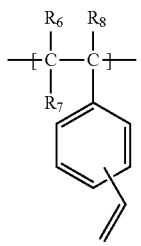

(7)

In Formula (7), $R_6$ to $R_8$ each independently represent a hydrogen atom or an alkyl group having 1 to 6 carbon atoms.

According to such a configuration, it is possible to obtain a resin composition which provides a cured product exhibiting low dielectric properties and high heat resistance.

In the resin composition, the polymer preferably further has a structural unit represented by the following Formula (8) in the molecule.

[Chem. 32]

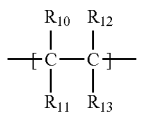

(8)

In Formula (8), $R_{10}$ to $R_{12}$ each independently represent a hydrogen atom or an alkyl group having 1 to 6 carbon atoms and $R_{13}$ represents an aryl group.

According to such a configuration, it is possible to obtain a resin composition which provides a cured product exhibiting low dielectric properties and high heat resistance.

In the resin composition, the aryl group in the structural unit represented by Formula (8) preferably includes an aryl group having an alkyl group having 1 to 6 carbon atoms.

According to such a configuration, it is possible to obtain a resin composition which provides a cured product exhibiting low dielectric properties and high heat resistance.

In the resin composition, the crosslinking type curing agent (B) preferably includes at least one selected from the group consisting of styrene, divinylbenzene, a trialkenyl isocyanurate compound, a polybutadiene compound, a maleimide compound, and an acenaphthylene compound.

According to such a configuration, it is possible to obtain a resin composition which provides a cured product exhibiting low dielectric properties and high heat resistance.

In the resin composition, the maleimide compound preferably includes a monofunctional maleimide compound having one maleimide group in the molecule.

According to such a configuration, it is possible to obtain a resin composition which provides a cured product exhibiting low dielectric properties and high heat resistance.

In the resin composition, the monofunctional maleimide compound preferably includes a compound represented by the following Formula (9) or a compound represented by the following Formula (10).

[Chem. 33]

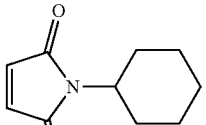

(9)

[Chem. 34]

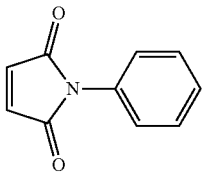

(10)

According to such a configuration, it is possible to obtain a resin composition which provides a cured product exhibiting low dielectric properties and high heat resistance.

Another aspect of the present invention is a prepreg including the resin composition or a semi-cured product of the resin composition, and a fibrous base material.

According to such a configuration, it is possible to provide a prepreg which suitably provides a cured product exhibiting low dielectric properties and high heat resistance.

Another aspect of the present invention is a film with resin including a resin layer containing the resin composition or a semi-cured product of the resin composition, and a support film.

According to such a configuration, it is possible to provide a film with resin which suitably provides a cured product exhibiting low dielectric properties and high heat resistance.

Another aspect of the present invention is a metal foil with resin including a resin layer containing the resin composition or a semi-cured product of the resin composition, and a metal foil.

According to such a configuration, it is possible to provide a metal foil with resin which suitably provides a cured product exhibiting low dielectric properties and high heat resistance.

Another aspect of the present invention is a metal-clad laminate including an insulating layer containing a cured product of the resin composition or a cured product of the prepreg, and a metal foil.

According to such a configuration, it is possible to provide a metal-clad laminate which includes an insulating layer exhibiting low dielectric properties and high heat resistance.

Another aspect of the present invention is a wiring board including an insulating layer containing a cured product of the resin composition or a cured product of the prepreg, and wiring.

According to such a configuration, it is possible to provide a wiring board which includes an insulating layer exhibiting low dielectric properties and high heat resistance.

According to the present invention, it is possible to provide a resin composition which provides a cured product exhibiting low dielectric properties and high heat resistance. According to the present invention, it is possible to provide a prepreg, a film with resin, a metal foil with resin, a metal-clad laminate, and a wiring board which are obtained using the resin composition.

Hereinafter, the present invention will be described more specifically with reference to Examples, but the scope of the present invention is not limited thereto.

EXAMPLES

Examples 1 to 17 and Comparative Examples 1 to 10

The respective components to be used when preparing resin compositions in the present Examples will be described.

(Resin Compound)

Modified PPE1: Modified polyphenylene ether compound having a group represented by Formula (1) at the molecular terminal, specifically, a modified polyphenylene ether compound obtained by reacting polyphenylene ether with chloromethylstyrene. Namely, the compound (A) having at least one group represented by Formula (1) in the molecule.

More specifically, a modified polyphenylene ether compound obtained by performing a reaction as follows.

First, 200 g of polyphenylene ether (SA90 manufactured by SABIC Innovative Plastics IP BV, number of terminal hydroxyl groups: 2, weight average molecular weight Mw: 1700), 30 g of a mixture containing p-chloromethylstyrene and m-chloromethylstyrene at a mass ratio of 50:50 (chloromethylstyrene: CMS manufactured by Tokyo Chemical Industry Co., Ltd.), 1.227 g of tetra-n-butylammonium bromide as a phase transfer catalyst, and 400 g of toluene were introduced into a 1-liter three-necked flask equipped with a temperature controller, a stirrer, cooling equipment, and a dropping funnel and stirred. Moreover, the mixture was stirred until polyphenylene ether, chloromethylstyrene, and tetra-n-butylammonium bromide were dissolved in toluene. At that time, the mixture was gradually heated until the liquid temperature finally reached 75° C. Thereafter, an aqueous sodium hydroxide solution (20 g of sodium hydroxide/20 g of water) as an alkali metal hydroxide was added dropwise to the solution over 20 minutes. Thereafter, the mixture was further stirred at 75° C. for 4 hours. Next, the resultant in the flask was neutralized with hydrochloric acid at 10% by mass and then a large amount of methanol was added into the flask. By doing so, a precipitate was generated in the liquid in the flask. In other words, the product contained in the reaction solution in the flask was reprecipitated. Thereafter, this precipitate was taken out by filtration, washed three times with a mixed solution of methanol and water contained at a mass ratio of 80:20, and then dried under reduced pressure at 80° C. for 3 hours.

The obtained solid was analyzed by $^1$H-NMR (400 MHz, CDCl$_3$, TMS). As a result of NMR measurement, a peak attributed to a vinylbenzyl group (ethenylbenzyl group) was observed at 5 to 7 ppm. This made it possible to confirm that the obtained solid was a modified polyphenylene ether compound having a vinylbenzyl group (ethenylbenzyl group) as the substituent at the molecular terminal in the molecule. Specifically, it was confirmed that the solid obtained was ethenylbenzylated polyphenylene ether. This obtained modified polyphenylene ether compound was a modified polyphenylene ether compound represented by Formula (19), where Y was a dimethylmethylene group (a group represented by Formula (17), where $R_{42}$ and $R_{43}$ were a methyl group), Z was a phenylene group, $R_1$ to $R_3$ were a hydrogen atom, and n was 1.

The number of terminal functional groups in the modified polyphenylene ether compound was measured as follows.

First, the modified polyphenylene ether compound was accurately weighed. The weight at that time is defined as X (mg). Thereafter, this modified polyphenylene ether compound weighed was dissolved in 25 mL of methylene chloride, 100 µL of an ethanol solution of tetraethylammonium hydroxide (TEAH) at 10 mass % (TEAH:ethanol (volume ratio)=15:85) was added to the solution, and then the absorbance (Abs) of this mixture at 318 nm was measured using a UV spectrophotometer (UV-1600 manufactured by Shimadzu Corporation). Thereafter, the number of terminal hydroxyl groups in the modified polyphenylene ether compound was calculated from the measurement result using the following equation.

Residual OH amount (µmol/g)=[(25×Abs)/(ε×OPL× X)]×10$^6$

Here, ε indicates the extinction coefficient and is 4700 L/mol·cm. OPL indicates the cell path length and is 1 cm.

Since the calculated residual OH amount (the number of terminal hydroxyl groups) in the modified polyphenylene ether compound is almost zero, it has been found that the hydroxyl groups in the polyphenylene ether before being modified have almost been modified. From this fact, it has been found that the number of terminal hydroxyl groups decreased from the number of terminal hydroxyl groups in polyphenylene ether before being modified is the number of terminal hydroxyl groups in polyphenylene ether before being modified. In other words, it has been found that the number of terminal hydroxyl groups in polyphenylene ether before being modified is the number of terminal functional groups in the modified polyphenylene ether compound. That is, the number of terminal functional groups was two.

The intrinsic viscosity (IV) of the modified polyphenylene ether compound was measured in methylene chloride at 25° C. Specifically, the intrinsic viscosity (IV) of the modified polyphenylene ether compound was measured in a methylene chloride solution (liquid temperature: 25° C.) of the modified polyphenylene ether compound at 0.18 g/45 ml using a viscometer (AVS500 Visco System manufactured by SCHOTT Instruments GmbH). As a result, the intrinsic viscosity (IV) of the modified polyphenylene ether compound was 0.086 dl/g.

The molecular weight distribution of the modified polyphenylene ether compound was measured by GPC. Moreover, the weight average molecular weight (Mw) was calculated from the obtained molecular weight distribution. As a result, Mw was 2,300.

The equivalent (vinyl equivalent) of the vinyl group included in the group that was represented by Formula (1) and contained a hydrogen atom as $R_1$ to $R_3$ in the modified polyphenylene ether compound was calculated through iodine value measurement by the Wyeth method. Specifically, the compound to be measured was first dissolved in chloroform so that the concentration was 0.3 g/35 mL to 0.3 g/25 mL Excess amount of iodine chloride was added to the double bonds present in this solution. By doing so, the double bond was reacted with iodine chloride, this reaction proceeded sufficiently, and then a 20 mass % potassium iodide aqueous solution was added to the solution after being subjected to the reaction to extract the iodine component remaining in the solution after being subjected to the reaction into the aqueous phase in the form of $I_3^-$. This aqueous phase into which $I_3^-$ was extracted was titrated with a sodium thiosulfate aqueous solution (0.1 mol/L sodium thiosulfate standard solution), and the iodine value was calculated. The following equation was used to calculate the iodine value.

Iodine value=[($B-A$)×$F$×1.269]/mass of compound (g)

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

As a result of the measurement, the equivalent (vinyl equivalent) of the vinyl group included in the group that was represented by Formula (1) and contained a hydrogen atom as $R_1$ to $R_3$ in the modified polyphenylene ether compound was 1000.

Modified PPE2: Modified polyphenylene ether compound having a vinylbenzyl group (ethenylbenzyl group) at the terminal (OPE-2st 1200 manufactured by MITSUBISHI GAS CHEMICAL COMPANY, INC., the compound (A) having at least one group represented by Formula (1) in the molecule, Mw: 1400, and a modified polyphenylene ether compound represented by Formula (18), where Z is a phenylene group, $R_1$ to $R_3$ are a hydrogen atom, and n is 0)

Polymer 1: ODV-XET (X03) manufactured by NIPPON STEEL Chemical & Materials Co., Ltd. (a polymer having a structural unit represented by Formula (5) in the molecule: an aromatic polymer having a structural unit derived from a bifunctional aromatic compound in which two carbon-carbon unsaturated double bonds are bonded to an aromatic ring and at least one group represented by Formula (1), a compound having structural units represented by Formulas (20) to (22) (the compound (A) having at least one group represented by Formula (1) in the molecule), weight average molecular weight Mw: 26300, equivalent (vinyl equivalent) of the vinyl group included in the group that was represented by Formula (1) and contained a hydrogen atom as $R_1$ to $R_3$: 510)

Polymer 2: ODV-XET (X04) manufactured by NIPPON STEEL Chemical & Materials Co., Ltd. (a polymer having a structural unit represented by Formula (5) in the molecule: an aromatic polymer having a structural unit derived from a bifunctional aromatic compound in which two carbon-carbon unsaturated double bonds are bonded to an aromatic ring and at least one group represented by Formula (1), a compound having structural units represented by Formulas (20) to (22) (the compound (A) having at least one group represented by Formula (1) in the molecule), weight average molecular weight Mw: 31100, equivalent (vinyl equivalent) of the vinyl group included in the group that was represented by Formula (1) and contained a hydrogen atom as $R_1$ to $R_3$: 380)

Polymer 3: ODV-XET (X05) manufactured by NIPPON STEEL Chemical & Materials Co., Ltd. (a polymer having a structural unit represented by Formula (5) in the molecule: an aromatic polymer having a structural unit derived from a bifunctional aromatic compound in which two carbon-carbon unsaturated double bonds are bonded to an aromatic ring and at least one group represented by Formula (1), a compound having structural units represented by Formulas (20) to (22) (the compound (A) having at least one group represented by Formula (1) in the molecule), weight average molecular weight Mw: 39500, equivalent (vinyl equivalent) of the vinyl group included in the group that was represented by Formula (1) and contained a hydrogen atom as $R_1$ to $R_3$: 320)

The equivalent (vinyl equivalent) of the vinyl group included in the group that was represented by Formula (1) and contained a hydrogen atom as $R_1$ to $R_3$ in the polymers 1 to 3 was calculated through iodine value measurement by the Wyeth method. Specifically, the compound to be measured was first dissolved in chloroform so that the concentration was 0.3 g/35 mL to 0.3 g/25 mL. Excess amount of iodine chloride was added to the double bonds present in this solution. By doing so, the double bond was reacted with iodine chloride, this reaction proceeded sufficiently, and then a 20 mass % potassium iodide aqueous solution was added to the solution after being subjected to the reaction to extract the iodine component remaining in the solution after being subjected to the reaction into the aqueous phase in the form of $I_3^-$. This aqueous phase into which $I_3^-$ was extracted was titrated with a sodium thiosulfate aqueous solution (0.1 mol/L sodium thiosulfate standard solution), and the iodine value was calculated. The following equation was used to calculate the iodine value.

Iodine value=[($B-A$)×$F$×1.269]/mass of compound (g)

In the equation, B denotes the titration volume (cc) of the 0.1 mol/L sodium thiosulfate standard solution required for the blank test, A denotes the titration volume (cc) of 0.1 mol/L sodium thiosulfate standard solution required for neutralization, and F denotes the titer of sodium thiosulfate.

Butadiene-styrene oligomer: Ricon 100 manufactured by CRAY VALLEY (Crosslinking Type Curing Agent)

Triallyl isocyanurate: TAIC manufactured by Nihon Kasei CO., LTD.

Divinylbenzene: DVB810 manufactured by NIPPON STEEL Chemical & Materials Co., Ltd.

Polybutadiene: B-1000 manufactured by NIPPON SODA CO., LTD.

Bifunctional maleimide: 3,3-Dimethyl-5,5'-diethyl-4,4'-diphenylmethanebismaleimide (BMI-5100 manufactured by Daiwa Kasei Industry Co., Ltd.)

Monofunctional maleimide 1: IMILEX C manufactured by NIPPON SHOKUBAI CO., LTD. (compound represented by Formula (9))

Monofunctional maleimide 2: IMILEX P manufactured by NIPPON SHOKUBAI CO., LTD. (compound represented by formula (10))

Acenaphthylene: Acenaphthylene manufactured by JFE Chemical Corporation

Methacryl-modified PPE: Modified polyphenylene ether obtained by modifying the terminal hydroxyl groups of polyphenylene ether with a methacryl group (a methacryl-modified polyphenylene ether compound represented by Formula (23), where Y is a dimethylmethylene group (a group represented by Formula (17), where $R_{42}$ and $R_{43}$ are a methyl group), SA9000 manufactured by SABIC Innovative Plastics, weight average molecular weight Mw: 2000, number of terminal functional groups: 2)

(Initiator)

Azo initiator 1: VR-110 manufactured by FUJIFILM Wako Pure Chemical Corporation (an azo compound which has an azo group in the molecule and has no hetero atom other than the nitrogen atom constituting the azo group, a compound represented by Formula (3))

Azo initiator 2: VAm-110 manufactured by FUJIFILM Wako Pure Chemical Corporation (an azo compound which has an azo group in the molecule and has no hetero atom other than the nitrogen atom constituting the azo group, 2,2'-azobis(N-butyl-2-methylpropionamide))

Peroxide: α,α'-di(t-butylperoxy)diisopropylbenzene (Perbutyl P (PBP) manufactured by NOF CORPORATION)

(Preparation Method)

First, the respective components were added to and mixed in toluene at the composition (parts by mass) presented in Tables 3 to 5 so that the solid concentration was 55% by mass. The mixture was stirred for 60 minutes. By doing so, a varnish-like resin composition (varnish) was obtained.

Next, the obtained varnish was impregnated into a fibrous base material (glass cloth: L2116, #2116 type, L Glass manufactured by Asahi Kasei Corporation) and then heated and dried at 110° C. for about 2 to 8 minutes, thereby fabricating a prepreg. At that time, the content (resin content) of the components constituting the resin by the curing reaction, such as a resin compound, a crosslinking type curing agent, and an initiator, with respect to the prepreg was adjusted to be about 55% by mass.

Thereafter, each of the obtained prepregs was stacked by six sheets and heated to a temperature of 200° C. at a rate of temperature rise of 3.5° C./min and heated and pressed under the conditions of 200° C., 120 minutes, and a pressure of 3 MPa, thereby obtaining an evaluation substrate (cured product of prepreg).

The varnish, prepreg, and evaluation substrate prepared in the manner described above were evaluated by the following methods.

[Dielectric Loss Tangent]

The dielectric loss tangent of the evaluation substrate at 10 GHz was measured by the cavity resonator perturbation method. Specifically, the dielectric loss tangent of the evaluation substrate at 10 GHz was measured using a network analyzer (N5230A manufactured by Keysight Technologies).

[Oven Heat Resistance]

In conformity to the JIS C 6481 standard, the evaluation substrate was left to stand for 1 hour in a thermostat set to a predetermined temperature and then taken out. Thereafter, the taken out metal-clad laminate was visually observed. If abnormality such as swelling was not confirmed even when the temperature was 280° C., the oven heat resistance was evaluated as "Very Good". If abnormality such as swelling was confirmed when the temperature was 280° C. but abnormality such as swelling was not confirmed when the temperature was 260° C., the oven heat resistance was evaluated as "Good". If abnormality such as swelling was confirmed when the temperature was 260° C., the oven heat resistance was evaluated as "Poor".

[Solder Heat Resistance]

A copper foil-clad laminate (metal foil-clad laminate) having a thickness of about 0.8 mm and copper foils attached to both sides thereof was obtained by setting the number of prepregs to be stacked to six sheets when fabricating the evaluation substrate. This formed copper foil-clad laminate was cut into 50 mm×50 mm and the copper foils on both sides were removed by etching. The laminate for evaluation thus obtained was held for 6 hours under at a temperature of 121° C. and a relative humidity of 100%. Thereafter, this laminate for evaluation was immersed in a solder bath at 288° C. for 10 seconds. The immersed laminate was visually observed to confirm the occurrence of measling and swelling. If the occurrence of measling and swelling was not confirmed, the solder heat resistance was evaluated as "Very Good". Separately, similar evaluation was performed using a solder bath at 260° C. instead of the solder bath at 288° C. If the occurrence of measling and swelling was confirmed at 288° C. but the occurrence of measling and swelling was not confirmed at 260° C., the solder heat resistance was evaluated as "Good". If the occurrence of measling and swelling was confirmed even at 260° C., the solder heat resistance was evaluated as "Poor".

The results of the respective evaluations are presented in Tables 3 to 5.

TABLE 3

| | | | Examples | | | | | |
|---|---|---|---|---|---|---|---|---|
| | | | 1 | 2 | 3 | 4 | 5 | 6 |
| Composition (parts by mass) | Resin compound | Modified PPE1 | 70 | 70 | 70 | 70 | 70 | 70 |
| | | Modified PPE2 | — | — | — | — | — | — |
| | | Butadiene-styrene oligomer | — | — | — | — | — | — |
| | Crosslinking type curing agent | Triallyl isocyanurate | 30 | 30 | 30 | — | — | — |
| | | Divinylbenzene | — | — | — | 30 | — | — |
| | | Polybutadiene | — | — | — | — | 30 | — |
| | | Bifunctional maleimide | — | — | — | — | — | 30 |
| | | Monofunctional maleimide 1 | — | — | — | — | — | — |
| | | Monofunctional maleimide 2 | — | — | — | — | — | — |
| | | Acenaphthylene | — | — | — | — | — | — |
| | Initiator | Azo initiator 1 | 1 | 0.5 | 2 | 1 | 1 | 1 |
| | | Azo initiator 2 | — | — | — | — | — | — |
| | | Peroxide | — | — | — | — | — | — |
| Evaluation | Dielectric loss tangent | | 0.0022 | 0.0022 | 0.0022 | 0.0021 | 0.0021 | 0.0023 |
| | Heat resistance | Oven heat resistance | Very Good | Very Good | Good | Very Good | Good | Very Good |
| | | Moisture absorption solder heat resistance | Very Good | Very Good | Good | Good | Very Good | Very Good |

TABLE 3-continued

|  |  |  | Examples |  |  |  | Comparative Example |
|---|---|---|---|---|---|---|---|
|  |  |  | 7 | 8 | 9 | 10 | 1 |
| Composition (parts by mass) | Resin compound | Modified PPE1 | 70 | 70 | 70 | — | 70 |
|  |  | Modified PPE2 | — | — | — | 70 | — |
|  |  | Butadiene-styrene oligomer | — | — | — | — | — |
|  | Crosslinking type curing agent | Triallyl isocyanurate | — | — | — | 30 | — |
|  |  | Divinylbenzene | — | — | — | — | — |
|  |  | Polybutadiene | — | — | — | — | — |
|  |  | Bifunctional maleimide | — | — | — | — | — |
|  |  | Monofunctional maleimide 1 | 30 | — | — | — | 30 |
|  |  | Monofunctional maleimide 2 | — | 30 | — | — | — |
|  |  | Acenaphthylene | — | — | 30 | — | — |
|  | Initiator | Azo initiator 1 | 1 | 1 | 1 | 1 | — |
|  |  | Azo initiator 2 | — | — | — | — | 1 |
|  |  | Peroxide | — | — | — | — | — |
| Evaluation | Dielectric loss tangent |  | 0.0021 | 0.0022 | 0.0021 | 0.0022 | 0.0028 |
|  | Heat resistance | Oven heat resistance | Very Good | Very Good | Very Good | Very Good | Good |
|  |  | Moisture absorption solder heat resistance | Very Good | Very Good | Very Good | Very Good | Good |

|  |  |  | Comparative Example |  |  |  |  |
|---|---|---|---|---|---|---|---|
|  |  |  | 2 | 3 | 4 | 5 | 6 |
| Composition (parts by mass) | Resin compound | Modified PPE1 | 70 | — | 70 | — | — |
|  |  | Modified PPE2 | — | — | — | 70 | 70 |
|  |  | Butadiene-styrene oligomer | — | 70 | — | — | — |
|  | Crosslinking type curing agent | Triallyl isocyanurate | — | 30 | 30 | — | — |
|  |  | Divinylbenzene | — | — | — | — | — |
|  |  | Polybutadiene | — | — | — | — | — |
|  |  | Bifunctional maleimide | — | — | — | — | — |
|  |  | Monofunctional maleimide 1 | 30 | — | — | 30 | 30 |
|  |  | Monofunctional maleimide 2 | — | — | — | — | — |
|  |  | Acenaphthylene | — | — | — | — | — |
|  | Initiator | Azo initiator 1 | — | 1 | — | — | — |
|  |  | Azo initiator 2 | — | — | — | 1 | — |
|  |  | Peroxide | 1 | — | — | — | 1 |
| Evaluation | Dielectric loss tangent |  | 0.0029 | 0.0020 | 0.0022 | 0.0028 | 0.0029 |
|  | Heat resistance | Oven heat resistance | Very Good | Poor | Poor | Good | Very Good |
|  |  | Moisture absorption solder heat resistance | Very Good | Poor | Poor | Good | Very Good |

TABLE 4

|  |  |  | Examples |  |  |  |  |
|---|---|---|---|---|---|---|---|
|  |  |  | 11 | 12 | 13 | 14 | 15 |
| Composition (parts by mass) | Resin compound | Modified PPE1 | — | — | — | — | — |
|  |  | Polymer 1 | — | — | 70 | — | — |
|  |  | Polymer 2 | 70 | 70 | — | 70 | — |
|  |  | Polymer 3 | — | — | — | — | 70 |
|  |  | Butadiene-styrene oligomer | — | — | — | — | — |
|  | Crosslinking type curing agent | Triallyl isocyanurate | 30 | — | — | — | — |
|  |  | Divinylbenzene | — | — | 30 | 30 | 30 |
|  |  | Acenaphthylene | — | 30 | — | — | — |
|  |  | Methacryl-modified PPE | — | — | — | — | — |
|  | Initiator | Azo initiator 1 | 1 | 1 | 1 | 1 | 1 |
|  |  | Azo initiator 2 | — | — | — | — | — |
|  |  | Peroxide | — | — | — | — | — |

TABLE 4-continued

| | | | | | | | |
|---|---|---|---|---|---|---|---|
| Evaluation | Dielectric loss tangent | | 0.0019 | 0.0018 | 0.0018 | 0.0018 | 0.0018 |
| | Heat resistance | Oven heat resistance | Good | Very Good | Very Good | Very Good | Very Good |
| | | Moisture absorption solder heat resistance | Good | Very Good | Very Good | Very Good | Very Good |

| | | | Examples | | Comparative Example | | |
|---|---|---|---|---|---|---|---|
| | | | 16 | 17 | 3 | 4 | 7 |
| Composition (parts by mass) | Resin compound | Modified PPE1 | 30 | — | — | 70 | — |
| | | Polymer 1 | — | — | — | — | — |
| | | Polymer 2 | 40 | 70 | — | — | 70 |
| | | Polymer 3 | — | — | — | — | — |
| | | Butadiene-styrene oligomer | — | — | 70 | — | — |
| | Crosslinking type curing agent | Triallyl isocyanurate | — | — | 30 | 30 | — |
| | | Divinylbenzene | — | 20 | — | — | 30 |
| | | Acenaphthylene | 30 | — | — | — | — |
| | | Methacryl-modified PPE | — | 10 | — | — | — |
| | Initiator | Azo initiator 1 | 1 | 1 | 1 | — | — |
| | | Azo initiator 2 | — | — | — | — | 1 |
| | | Peroxide | — | — | — | — | — |
| Evaluation | Dielectric loss tangent | | 0.0021 | 0.0021 | 0.0020 | 0.0022 | 0.0024 |
| | Heat resistance | Oven heat resistance | Very Good | Very Good | Poor | Poor | Good |
| | | Moisture absorption solder heat resistance | Very Good | Very Good | Poor | Poor | Good |

| | | | | Comparative Example | | |
|---|---|---|---|---|---|---|
| | | | | 8 | 9 | 10 |
| Composition (parts by mass) | Resin compound | Modified PPE1 | | — | 70 | 70 |
| | | Polymer 1 | | — | — | — |
| | | Polymer 2 | | 70 | — | — |
| | | Polymer 3 | | — | — | — |
| | | Butadiene-styrene oligomer | | — | — | — |
| | Crosslinking type curing agent | Triallyl isocyanurate | | — | — | — |
| | | Divinylbenzene | | 30 | 30 | 30 |
| | | Acenaphthylene | | — | — | — |
| | | Methacryl-modified PPE | | — | — | — |
| | Initiator | Azo initiator 1 | | — | — | — |
| | | Azo initiator 2 | | — | 1 | — |
| | | Peroxide | | 1 | — | 1 |
| Evaluation | Dielectric loss tangent | | | 0.0024 | 0.0028 | 0.0028 |
| | Heat resistance | Oven heat resistance | | Very Good | Good | Very Good |
| | | Moisture absorption solder heat resistance | | Very Good | Good | Very Good |

As can be seen from Tables 3 and 4, when resin compositions containing the compound (A) having at least one azo group represented by Formula (1) in the molecule and the crosslinking type curing agent (B) contains the azo compound (C) (azo compound 1) that has an azo group in the molecule and has no heteroatom other than the nitrogen atom constituting the azo group (Examples 1 to 17), the dielectric loss tangent is low and the oven heat resistance and the moisture absorption solder heat resistance are also high. From this fact, it can be seen that these resin compositions are resin compositions which provide cured products exhibiting low dielectric properties and high heat resistance. It is considered that this is because the azo compound 1 is used as an initiator for reacting the compound (A) with the crosslinking type curing agent (B). More specifically, it is considered that this is because a highly polar group such as a CN group is hardly generated in the cured product of the resin composition when the compound (A) and the crosslinking type curing agent (B) are reacted using the azo compound 1 as an initiator.

In contrast, in the case of containing not the azo compound 1 but an azo compound (azo compound 2) containing a hetero atom in addition to the nitrogen atom constituting the azo group (Comparative Example 1, Comparative Example 5, Comparative Example 7, and Comparative Example 9), the dielectric loss tangent is higher than that in Examples 1 to 17. It is considered that this is because this azo compound 2 also acts as an initiator similarly to the azo compound 1, and a cured product exhibiting high heat resistance is thus obtained, but a highly polar group such as a CN group is easily generated in the cured product of the resin composition.

Even in the case of containing not the azo compound 1 but a peroxide (Comparative Example 2, Comparative Example 6, Comparative Example 8, and Comparative Example 10), the dielectric loss tangent is higher than that in Examples 1 to 17. It is considered that this is because the peroxide acts as an initiator and a cured product exhibiting high heat resistance is thus obtained, but a highly polar group such as a hydroxyl group is easily generated in the cured product of the resin composition.

In the case of containing not the compound (A) but a compound which does not have a group represented by Formula (1) in the molecule (Comparative Example 3), the curability is considered to decrease, and a cured product exhibiting sufficiently high heat resistance is not obtained.

In the case of not containing a compound which can act as an initiator such as the azo compound 1 (Comparative Example 4) as well, the curability is considered to decrease, and a cured product exhibiting sufficiently high heat resistance is not obtained.

The resin flowability and circuit filling property of the prepreg prepared in the manner described above were evaluated by the following methods.

[Resin Flowability of Prepreg]

The resin flowability of each prepreg was measured by a method conforming to JIS C 6521.

[Circuit Filling Property of Prepreg]

A copper foil having a thickness of 35 μm (GTHMP35 manufactured by Furukawa Electric Co., Ltd.) was laminated on both sides of the prepreg, and this laminated body as a body to be pressed was heated and pressed for 90 minutes at a temperature of 220° C. and a pressure of 30 kg/cm$^2$ to obtain a copper foil-clad laminate (metal foil-clad laminate) having a thickness of about 0.1 mm and copper foils attached on both sides thereof. A grid-like pattern was formed on the copper foils on both sides of this copper foil-clad laminate so that the remaining copper rate on each side was 50%, and wiring was thus formed. The prepregs were laminated on both sides of the substrate on which this wiring was formed one on each side, a copper foil having a thickness of 12 μm (GTHMP12 manufactured by Furukawa Electric Co., Ltd.) was further laminated thereon, and heating and pressurization were performed using this laminate as a body to be pressed under the same conditions as when the copper foil-clad laminate was manufactured. The double-sided copper foil of this formed laminate was removed by etching. In the laminate for evaluation thus obtained, if the resin composition derived from the prepreg sufficiently entered between the circuits and the formation of voids was not confirmed, the circuit filling property was evaluated as "Good". If the resin composition derived from the prepreg insufficiently entered between the circuits and the formation of voids was confirmed, the circuit filling property was evaluated as "Poor". Incidentally, the voids can be visually confirmed.

The results of the respective evaluations are presented in Table 5.

TABLE 5

|  |  |  | Examples | | Comparative Example | | | |
|---|---|---|---|---|---|---|---|---|
|  |  |  | 4 | 14 | 7 | 8 | 9 | 10 |
| Composition (parts by mass) | Resin compound | Modified PPE1 | 70 | — | — | — | 70 | 70 |
|  |  | Polymer 2 | — | 70 | 70 | 70 | — | — |
|  | Crosslinking type curing agent | Divinylbenzene | 30 | 30 | 30 | 30 | 30 | 30 |
|  | Initiator | Azo initiator 1 | 1 | 1 | — | — | — | — |
|  |  | Azo initiator 2 | — | — | 1 | — | 1 | — |
|  |  | Peroxide | — | — | — | 1 | — | 1 |
| Prepreg Evaluation | Resin flowability | | 10 | 10 | 10 | 3 | 10 | 4 |
|  | Circuit filling property | | Good | Good | Good | Poor | Good | Poor |
| Laminate Evaluation | Dielectric loss tangent | | 0.0021 | 0.0018 | 0.0024 | 0.0024 | 0.0028 | 0.0028 |
|  | Heat resistance | Oven heat resistance | Very Good | Very Good | Good | Very Good | Good | Very Good |
|  |  | Moisture absorption solder heat resistance | Very Good | Very Good | Good | Very Good | Good | Very Good |

As can be seen from Table 5, when resin compositions containing the compound (A) having at least one group represented by Formula (1) in the molecule and the cross-linking type curing agent (B) contains the azo compound (C) (azo compound 1) that has an azo group in the molecule and has no heteroatom other than the nitrogen atom constituting the azo group (Example 4 and Example 14), it can be seen that the resin flowability is higher and the circuit filling property is superior to resin compositions which do not contain the azo compound 1 but contain a peroxide (Comparative Example 8 and Comparative Example 10).

This application is based on Japanese Patent Application No. 2018-087155 filed on Apr. 27, 2018, Japanese Patent Application No. 2018-136061 filed on Jul. 19, 2018, and Japanese Patent Application No. 2019-045680 filed on Mar. 13, 2019, the contents of which are incorporated herein.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, it is possible to provide a resin composition which provides a cured product exhibiting low dielectric properties and high heat resistance. In addition, according to the present invention, a prepreg, a film with resin, a metal foil with resin, a metal-clad laminate, and a wiring board which are obtained using the resin composition are provided.

The invention claimed is:

1. A resin composition comprising:
   a compound (A) having at least one group represented by the following Formula (1) in a molecule;
   a crosslinking type curing agent (B); and
   an azo compound (C) that has an azo group in a molecule and has no heteroatom other than a nitrogen atom constituting the azo group:

[Chem. 1]

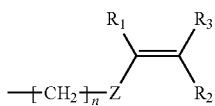
(1)

(in Formula (1), n represents 0 to 10, Z represents an arylene group, and $R_1$ to $R_3$ each independently represent a hydrogen atom or an alkyl group).

2. The resin composition according to claim 1, wherein the azo compound (C) includes a compound represented by the following Formula (2):

[Chem. 2]

$$R_4-N=N-R_5 \quad (2)$$

(in Formula (2), $R_4$ and $R_5$ each independently represent a hydrogen atom or an alkyl group).

3. The resin composition according to claim 2, wherein the alkyl group of $R_4$ and $R_5$ has 1 to 8 carbon atoms.

4. The resin composition according to claim 1, wherein the azo compound (C) includes at least either of a compound represented by the following Formula (3) or a compound represented by the following Formula (4),

[Chem. 3]

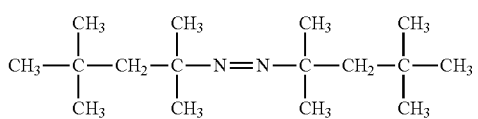
(3)

[Chem. 4]

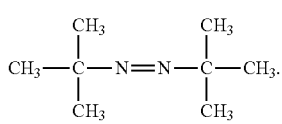
(4)

5. The resin composition according to claim 1, wherein the compound (A) has a weight average molecular weight of 1500 to 40,000.

6. The resin composition according to claim 1, wherein an equivalent of a vinyl group included in the group that is represented by the Formula (1) and contains a hydrogen atom as $R_1$ to $R_3$ in the compound (A) is 250 to 1200.

7. The resin composition according to claim 1, wherein the compound (A) includes a modified polyphenylene ether compound having the group represented by the Formula (1) at a molecule terminal.

8. The resin composition according to claim 1, wherein the compound (A) includes a polymer having a structural unit represented by the following Formula (5) in a molecule:

[Chem. 5]

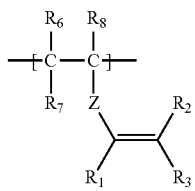
(5)

(in Formula (5), Z represents an arylene group, $R_1$ to $R_3$ each independently represent a hydrogen atom or an alkyl group, and $R_6$ to $R_8$ each independently represent a hydrogen atom or an alkyl group having 1 to 6 carbon atoms).

9. The resin composition according to claim 1, wherein the compound (A) includes a modified polyphenylene ether compound having the group represented by the Formula (1) at a molecule terminal and a polymer having a structural unit represented by the following Formula (5) in a molecule:

[Chem. 6]

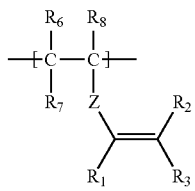
(5)

(in Formula (5), Z represents an arylene group, $R_1$ to $R_3$ each independently represent a hydrogen atom or an alkyl group, and $R_6$ to $R_8$ each independently represent a hydrogen atom or an alkyl group having 1 to 6 carbon atoms).

10. The resin composition according to claim 9, wherein a content of the modified polyphenylene ether compound is 5 to 50 parts by mass with respect to 100 parts by mass of a sum of the modified polyphenylene ether compound, the polymer, and the crosslinking type curing agent (B).

11. The resin composition according to claim 9, wherein a content of the polymer is 20 to 95 parts by mass with respect to 100 parts by mass of a sum of the modified polyphenylene ether compound, the polymer, and the crosslinking type curing agent (B).

12. The resin composition according to claim 8, wherein the polymer includes an aromatic polymer having a structural unit derived from a bifunctional aromatic compound in which two carbon-carbon unsaturated double bonds are bonded to an aromatic ring as the structural unit represented by the Formula (5).

13. The resin composition according to claim 12, wherein the aromatic polymer further has a structural unit derived from a monofunctional aromatic compound in which one carbon-carbon unsaturated double bond is bonded to an aromatic ring.

14. The resin composition according to claim 8, wherein the structural unit represented by the Formula (5) includes a structural unit represented by the following Formula (6):

[Chem. 7]

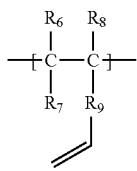
(6)

(in Formula (6), $R_6$ to $R_8$ each independently represent a hydrogen atom or an alkyl group having 1 to 6 carbon atoms and $R_9$ represents an arylene group having 6 to 12 carbon atoms).

15. The resin composition according to claim 14, wherein the structural unit represented by the Formula (6) includes a structural unit represented by the following Formula (7):

[Chem. 8]

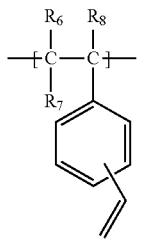
(7)

(in Formula (7), $R_6$ to $R_8$ each independently represent a hydrogen atom or an alkyl group having 1 to 6 carbon atoms).

16. The resin composition according to claim 8, wherein the polymer further has a structural unit represented by the following Formula (8) in a molecule:

[Chem. 9]

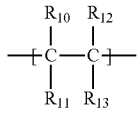
(8)

(in Formula (8), $R_{10}$ to $R_{12}$ each independently represent a hydrogen atom or an alkyl group having 1 to 6 carbon atoms and $R_{13}$ represents an aryl group).

17. The resin composition according to claim 16, wherein the aryl group in the structural unit represented by the Formula (8) includes an aryl group having an alkyl group having 1 to 6 carbon atoms.

18. The resin composition according to claim 1, wherein the crosslinking type curing agent (B) includes at least one selected from a group consisting of styrene, divinylbenzene, a trialkenyl isocyanurate compound, a polybutadiene compound, a maleimide compound, and an acenaphthylene compound.

19. A prepreg comprising:
the resin composition according to claim 1 or a semi-cured product of the resin composition; and
a fibrous base material.

20. A film with resin comprising:
a resin layer containing the resin composition according to claim 1 or a semi-cured product of the resin composition; and
a support film.

21. A metal foil with resin comprising:
a resin layer containing the resin composition according to claim 1 or a semi-cured product of the resin composition; and
a metal foil.

22. A metal-clad laminate comprising:
an insulating layer containing a cured product of the resin composition according to claim 1; and
a metal foil.

23. A wiring board comprising:
an insulating layer containing a cured product of the resin composition according to claim 1; and
wiring.

24. A metal-clad laminate comprising:
an insulating layer containing a cured product of the prepreg according to claim 19; and
a metal foil.

25. A wiring board comprising:
an insulating layer containing a cured product of the prepreg according to claim 19; and
wiring.

* * * * *